United States Patent
Kwon et al.

(10) Patent No.: US 6,884,715 B1
(45) Date of Patent: Apr. 26, 2005

(54) METHOD FOR FORMING A SELF-ALIGNED CONTACT WITH A SILICIDE OR DAMASCENE CONDUCTOR AND THE STRUCTURE FORMED THEREBY

(75) Inventors: Oh-Jung Kwon, Hopewell Junction, NY (US); Kangguo Cheng, Beacon, NY (US); Deok-kee Kim, Wappingers Falls, NY (US); Carl J. Radens, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/709,906

(22) Filed: Jun. 4, 2004

(51) Int. Cl.[7] .......................................... H01L 21/4763
(52) U.S. Cl. ...................... 438/638; 438/622; 438/637; 438/299; 438/672; 438/675
(58) Field of Search ................. 438/622–640, 438/687, 688, 672, 675, 257, 259, 299, 303, 256, 399

(56) References Cited

U.S. PATENT DOCUMENTS

| | | | |
|---|---|---|---|
| 5,879,986 A | * | 3/1999 | Sung .......................... 438/253 |
| 6,271,132 B1 | | 8/2001 | Xiang et al. |
| 6,303,447 B1 | * | 10/2001 | Chhagan et al. ............ 438/299 |
| 6,602,779 B1 | | 8/2003 | Li et al. |
| 6,603,204 B1 | | 8/2003 | Gates et al. |
| 6,613,621 B1 | | 9/2003 | Uh et al. |
| 6,617,257 B1 | | 9/2003 | Ni et al. |
| 6,787,460 B1 | * | 9/2004 | Lee et al. ................... 438/672 |

* cited by examiner

Primary Examiner—Tuan H. Nguyen
Assistant Examiner—Thanhha Pham
(74) Attorney, Agent, or Firm—Graham S. Jones, II; H. Daniel Schnurmann

(57) ABSTRACT

A method of forming a device including a conductor and a contact over a semiconductor substrate starts by depositing first dielectric and first hard mask layers on the substrate. Form a conductor slot through the hard mask and down into or through the first dielectric layer. Form a recessed conductor in the slot. Widen the slot in the hard mask to form a wide slot. Form a cap in the wide slot covering the conductor and overhanging exposed portions of the first dielectric layer. Deposit a second dielectric layer and a hard mask. Etch an initial contact hole through the second hard mask down to the top surface of the second dielectric layer. Etch a deep contact hole through the second dielectric layer, the first hard; mask and the first dielectric layer down to the substrate with an etchant selective to the capping layer. Fill the deep contact hole and the contact hole with contact metallization.

19 Claims, 26 Drawing Sheets

Stack DRAM

Metal Gate or SRAM

Capacitor contact over bit line for stack DRAM

High Density Interconnect Line for BEOL

METHOD FOR FORMING A SELF-ALIGNED CONTACT WITH A SILICIDE OR DAMASCENE CONDUCTOR AND THE STRUCTURE FORMED THEREBY

BACKGROUND OF INVENTION

This invention relates to methods of manufacture electronic devices with Self-Aligned Contact (SAC) structures formed in close proximity to conductors and devices manufactured thereby.

Prior art damascene structures with contacts include U.S. Pat. No. 6,613,621 to Uh et al. entitled "Methods of Forming Self-Aligned Contact Pads Using a Damascene Gate Process" and U.S. Pat. No. 6,271,132 to Xiang et al entitled "Self-Aligned Source and Drain Extensions Fabricated in a Damascene Contact and Gate Process".

A problem which has arisen with the tight dimensional requirements of semiconductor device circuits is the process margin for the process of manufacture of borderless SACs in such devices.

Another problem encountered is how to provide both an improved design and an improved a method of manufacture of SACs in close proximity to damascene gate electrodes of a MOSFET device.

An additional problem is how to provide both an improved design and an improved method of manufacture of an interconnect conductor line with the provision of adequate dielectric separation between an interconnect conductor and an SAC in close proximity thereto.

Still another problem is how to minimize the coupling capacitance between an SAC and an adjacent conductor or interconnect.

SUMMARY OF INVENTION

An object of this invention is to improve the process margin for the process of manufacture of a borderless SAC.

Another object of this invention is to provide an improved method of manufacture and an improved structure of an SAC in close proximity to a damascene gate electrode of a MOSFET device.

Still another object of this invention is to provide an improved method of manufacture and an improved structure of SACs in close proximity to interconnect conductor lines.

A further object of this invention is to provide an improved method of manufacture and an improved structure of a device including an SAC and an adjacent conductor or interconnect for reducing the coupling capacitance there between.

In accordance with this invention, a method of forming a device including a conductor and a contact over a semiconductor substrate comprises the following steps. Deposit a first dielectric layer on a semiconductor substrate with a top surface. Deposit a first hard mask layer over the top surface of the first dielectric layer. Form a conductor line slot in the device extending through the hard mask and at least down into the first dielectric layer. Form a conductor in the conductor line slot below the top surface of the first hard mask layer. Widen the conductor line slot in the hard mask layer to form a widened conductor line slot. Form a capping layer in the widened conductor line slot covering the conductor. Deposit a second dielectric layer over the device. Etch an initial contact hole through the second dielectric layer down to the top surface of the first hard mask layer. Etch a deep contact hole through first hard mask layer and first dielectric layer down to the substrate with an etchant selective to the capping layer, and fill the deep contact hole and the initial contact hole with contact metallization.

Preferably, the conductor line slot in the device extends through the hard mask and through the first dielectric layer and down to the substrate.

Preferably, a dielectric layer is formed on the surface of the substrate after forming the conductor line slot down to the substrate and before forming the conductor in the conductor slot.

Preferably, the etching of the deep contact hole forms a smooth tapered spacer surface in the deep contact hole on the capping layer over the conductor.

Preferably, the conductor line slot in the device extends through the hard mask and through only a portion of the first dielectric layer to a depth above the substrate.

Preferably, the first dielectric layer comprises a low k dielectric material and the capping layer comprises silicon nitride.

Preferably, the first dielectric layer comprises High Density Plasma (HDP) silicon oxide and the capping layer comprises silicon nitride.

Preferably, a second hard mask layer and a patterned photoresist mask are formed over the second dielectric layer before etching the contact hole through the second dielectric layer down to the top surface of the first hard mask layer and the patterned photoresist mask and the second hard mask layer are employed for patterning the initial contact hole.

Preferably, the conductor comprises a damascene conductor formed from conformal underlayers etched back into the slot.

Preferably, the conductor comprises a silicide conductor.

In accordance with another aspect of the invention, a method of forming a device including a conductor and a Self-Aligned Contact (SAC) over a semiconductor substrate comprises the following steps. Deposit a first InterLayer Dielectric (ILD1) layer on a semiconductor substrate with a top surface. Deposit a first hard mask layer ($HM_1$) having a top surface over the top surface of the ILD1 layer. Form a conductor line slot in the device extending through the hard mask and at least down into the ILD1 layer. Form a conductor in the conductor line slot below the top surface of the HM1 layer. Widen the conductor line slot in the HM1 layer to form a widened conductor liner slot above the ILD1 layer. Form a capping layer composed of silicon nitride in the widened conductor line slot covering the conductor and overhanging the ILD1 layer. Planarize the capping layer to the top surface of the HM1 layer. Deposit a second first InterLayer Dielectric (ILD2) layer over the device. Form a second hard mask layer (HM2) over the ILD2 layer. Form a photoresist mask over the HM2 layer. Etch an initial contact hole through the photoresist mask, the HM2 layer and the second dielectric layer down to the top surface of the HM1 layer. Etch a deep contact hole through the HM1 layer and ILD1 layer down to the substrate with an etchant selective to the capping layer, and fill the deep contact hole and the initial contact hole with contact metallization.

Preferably, the conductor line slot in the device extends through the HM1 mask and through the ILD1 layer and down to the substrate.

In accordance with another aspect of the invention, a method of forming a device including a conductor and a Self-Aligned Contact (SAC) over a semiconductor substrate comprises the following steps. Deposit a first InterLayer Dielectric (ILD1) layer on a semiconductor substrate with a top surface. Deposit a first hard mask layer (HM1) having a top surface over the top surface of the ILD1 layer. Form a conductor line slot in the device extending through the hard mask and at least down into the ILD4 layer. Form a conductor in the conductor line slot below the top surface of the HM1 layer. Widen the conductor line slot in the HM1 layer to form a widened conductor liner slot above the ILD1 layer. Form a capping layer composed of silicon nitride in the widened conductor line slot covering the conductor and overhanging the ILD1 layer. Planarize the capping layer to the top surface of the HM1 layer. Deposit a second first InterLayer Dielectric (ILD2) layer over the device. Form a second hard mask layer (HM2) over the ILD2 layer. Form a photoresist mask over the HM2 layer. Etch an initial contact hole through the photoresist mask, the HM2 layer and the second dielectric layer down to the top surface of the HM1 layer. Etch a deep contact hole through the HM1 layer and ILD1 layer down to the substrate with an etchant selective to the capping layer, and fill the deep contact hole and the initial contact hole with contact metallization.

Preferably, the conductor line slot in the device extends through the HM1 mask and through the ILD1 layer and down to the substrate.

Preferably, a dielectric layer is formed on the surface of the substrate after forming the conductor line slot down to the substrate and before forming the conductor in the conductor slot.

Preferably, the etching of the deep contact hole forms a smooth tapered spacer surface in the deep contact hole on the capping layer over the conductor.

Preferably, the conductor line slot in the device extends through the HM1 mask and through only a portion of the ILD1 layer to a depth above the substrate.

Preferably, the ILD1 layer comprises a low k dielectric material.

Preferably, the ILD1 layer comprises High Density Plasma (HDP) silicon oxide.

Preferably, the conductor comprises a damascene conductor formed from conformal underlayers etched back into the slot.

Preferably, the conductor comprises a silicide conductor.

In accordance with still another aspect of this invention, a device is provided including a conductor and a contact formed over a semiconductor substrate. A first dielectric layer is formed on the on the semiconductor substrate and a hard mask layer is formed atop the first dielectric layer. A conductor line slot extends through the hard mask and at least down into the first dielectric layer. A conductor is located in the conductor line slot below the top surface of the hard mask layer. A widened conductor line slot is formed in the hard mask layer. A capping layer is formed in the widened conductor line slot covering the conductor. A second dielectric layer is formed over the device including the capping layer and the hard mask with a contact hole extending through the second dielectric layer, and the hard mask layer, as well a portion of the capping layer and the first dielectric layer down to the substrate with the capping layer having a smoothly etched back surface. Contact metallization fills the contact hole.

BRIEF DESCRIPTION OF DRAWINGS

The foregoing and other aspects and advantages of this invention are explained and described below with reference to the accompanying drawings, in which.

DETAILED DESCRIPTION

Figure 1A:
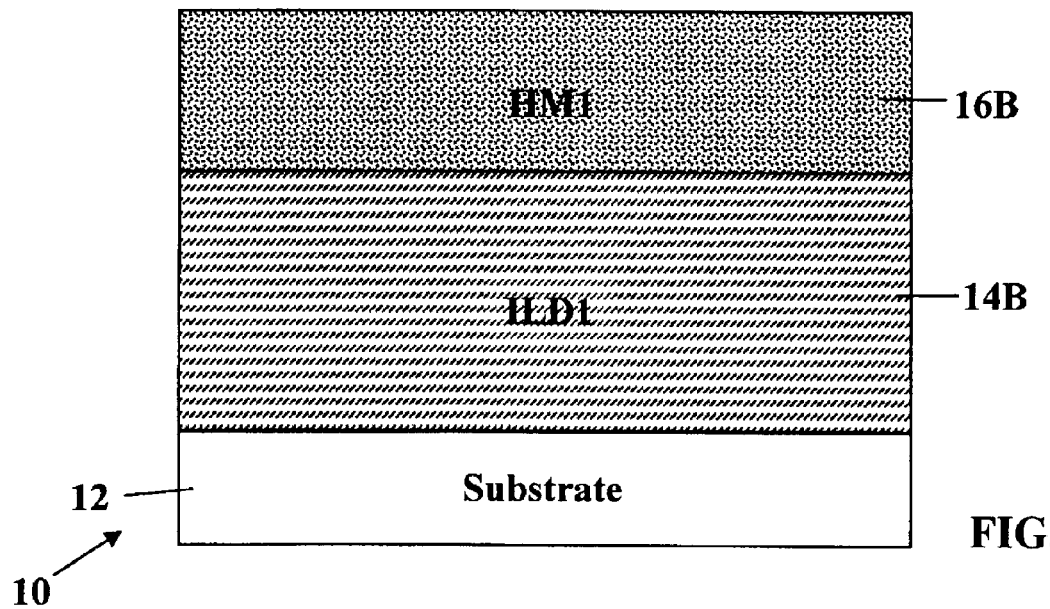
FIGS. 1A–1P show a series of processing steps in accordance with this invention for formation of an SAC next to a conductor line, separated therefrom by a conductor cap with a spacer surface juxtaposed with the SAC where the conductor cap is formed above the conductor line.
Figure 1B:
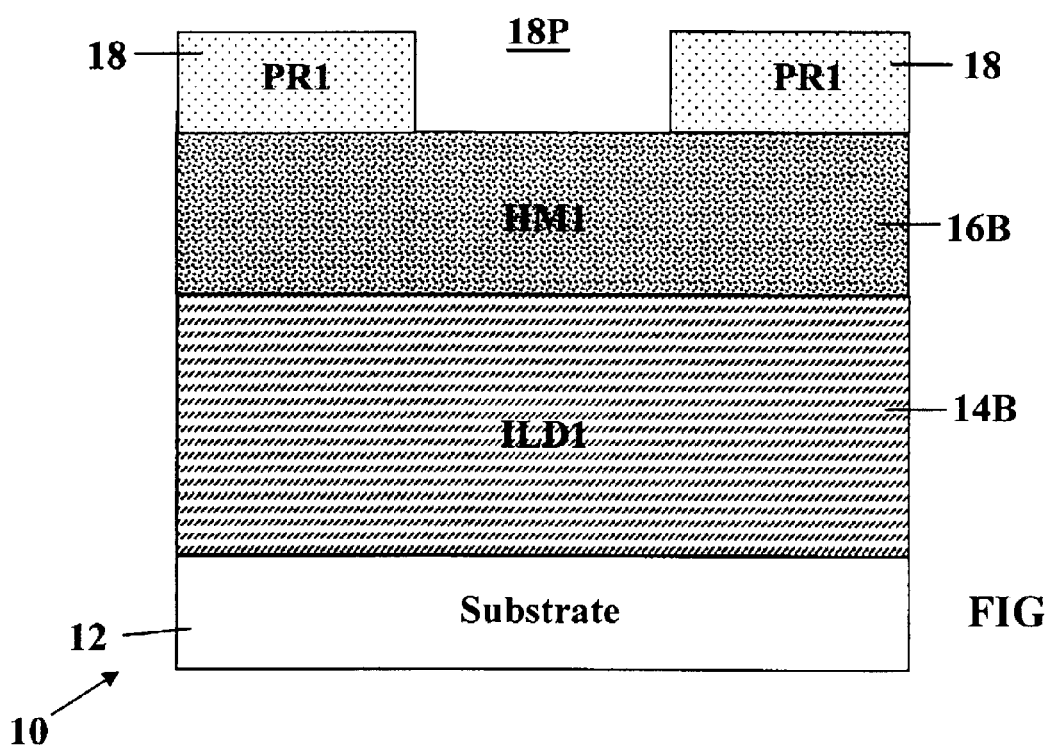
FIG. 1C' shows the result of forming a shallower slot for the conductor line in a first dielectric layer as an alternative result of the process step of FIG. 1C.
Figure 1C:
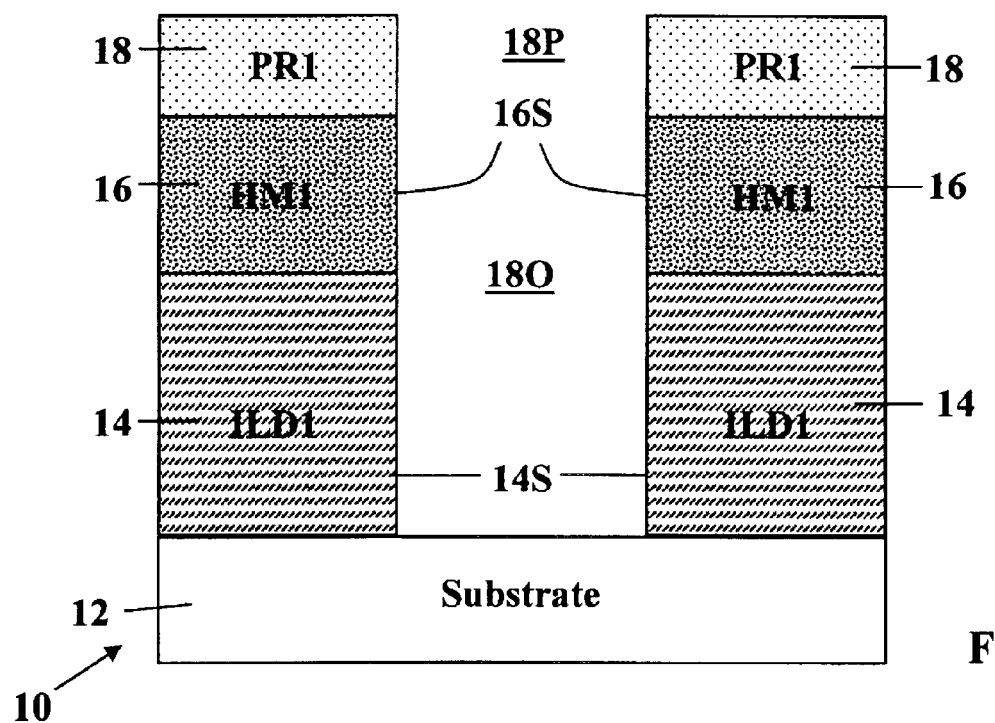
Figure 1D:
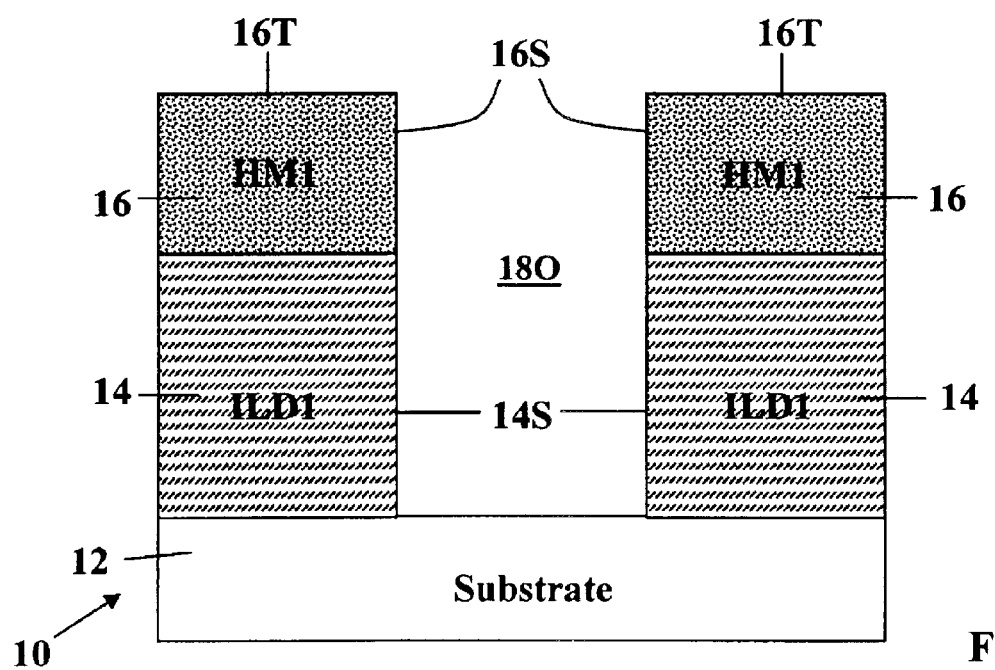
Figure 1E:
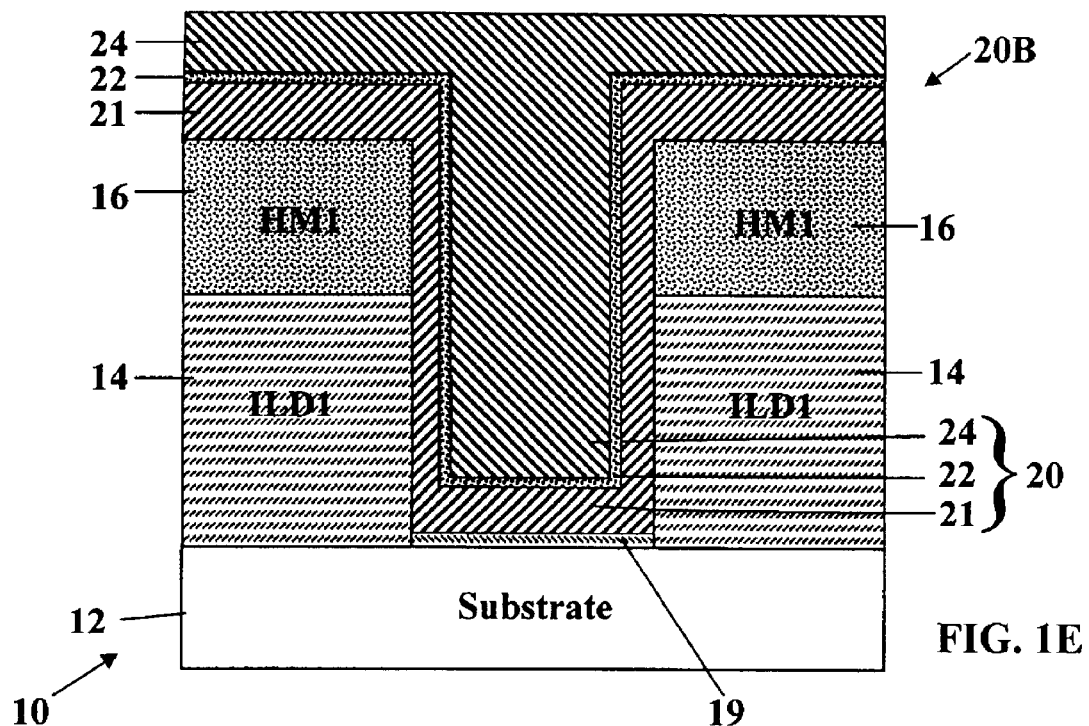
Figure 1F:
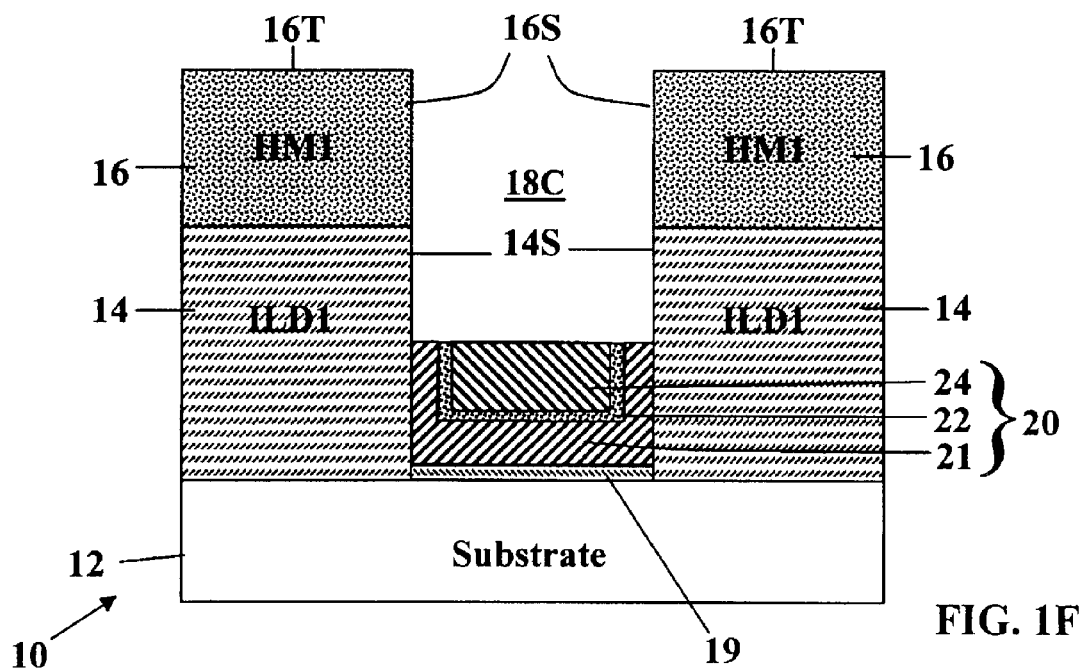
Figure 1G:
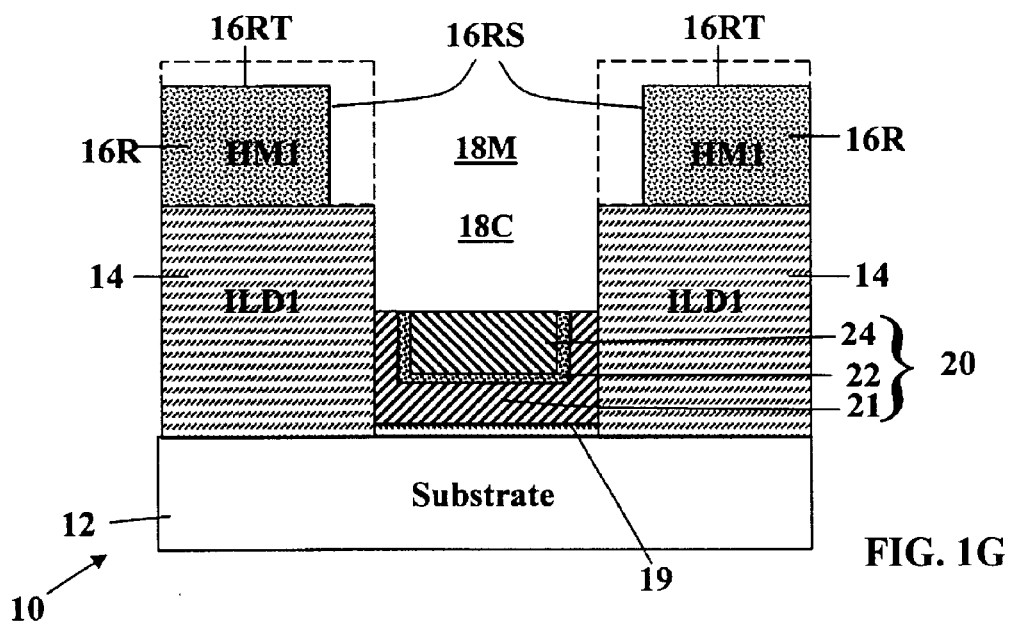
Figure 1H:
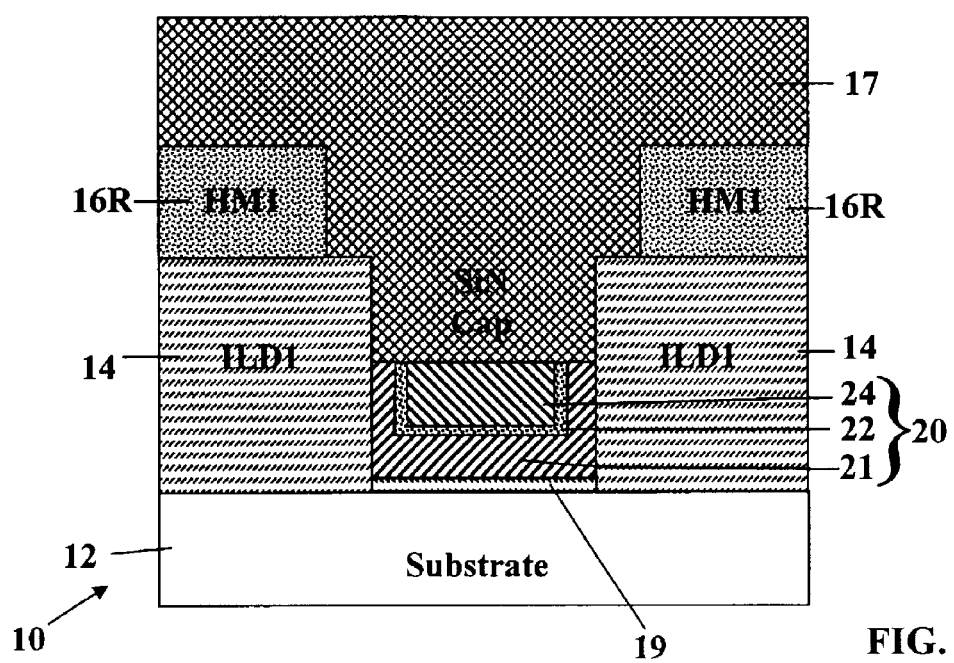
Figure 1I:
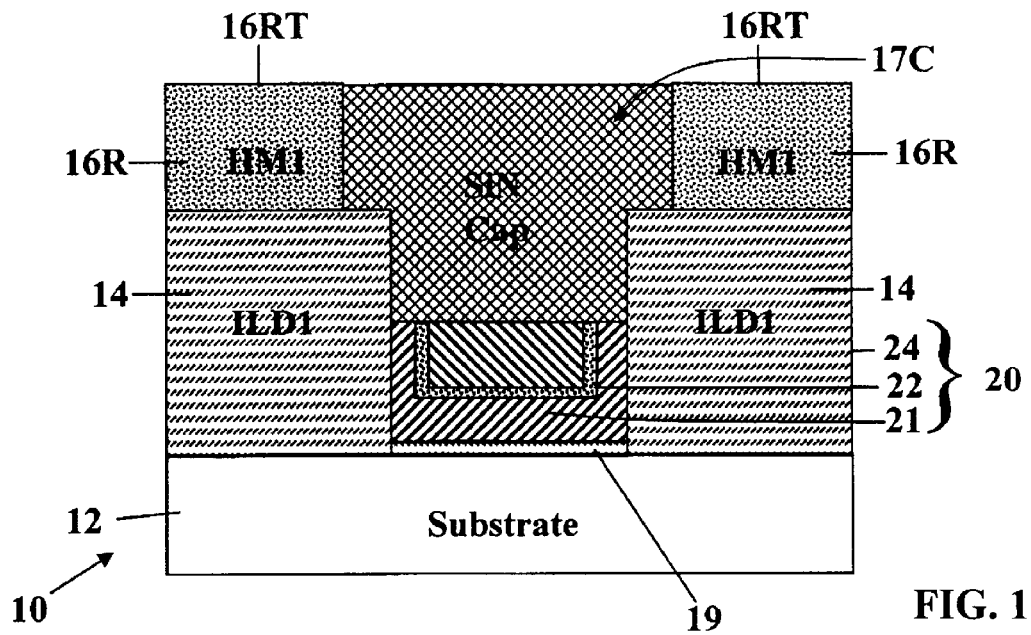
Figure 1J:
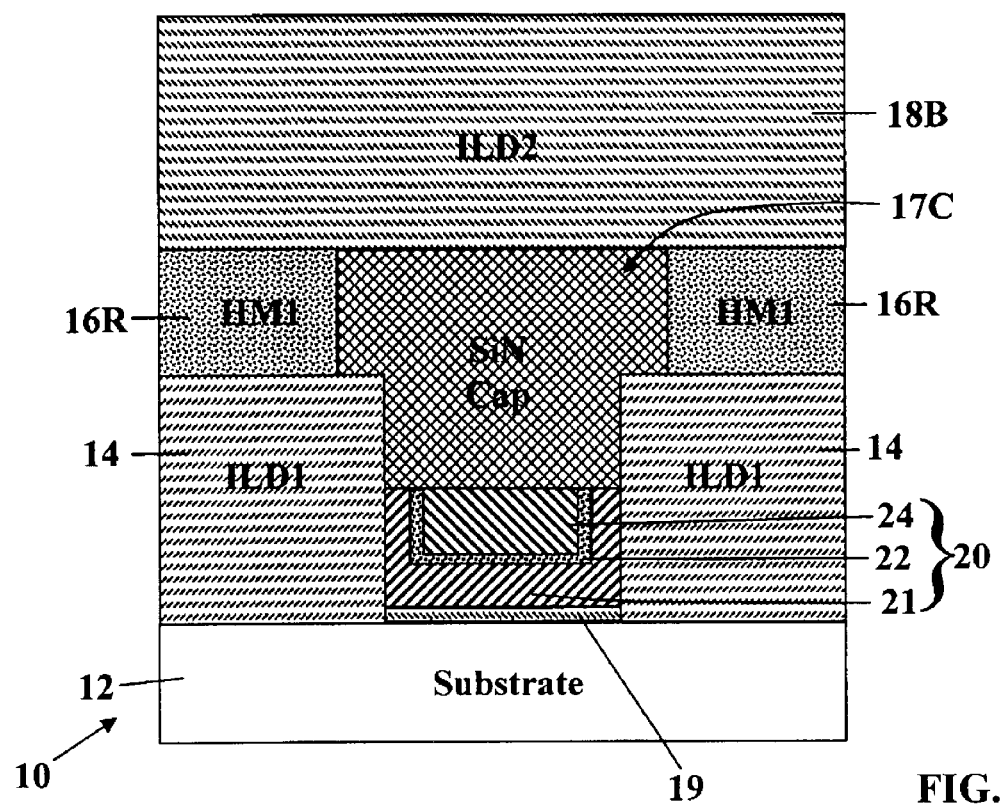
Figure 1K:
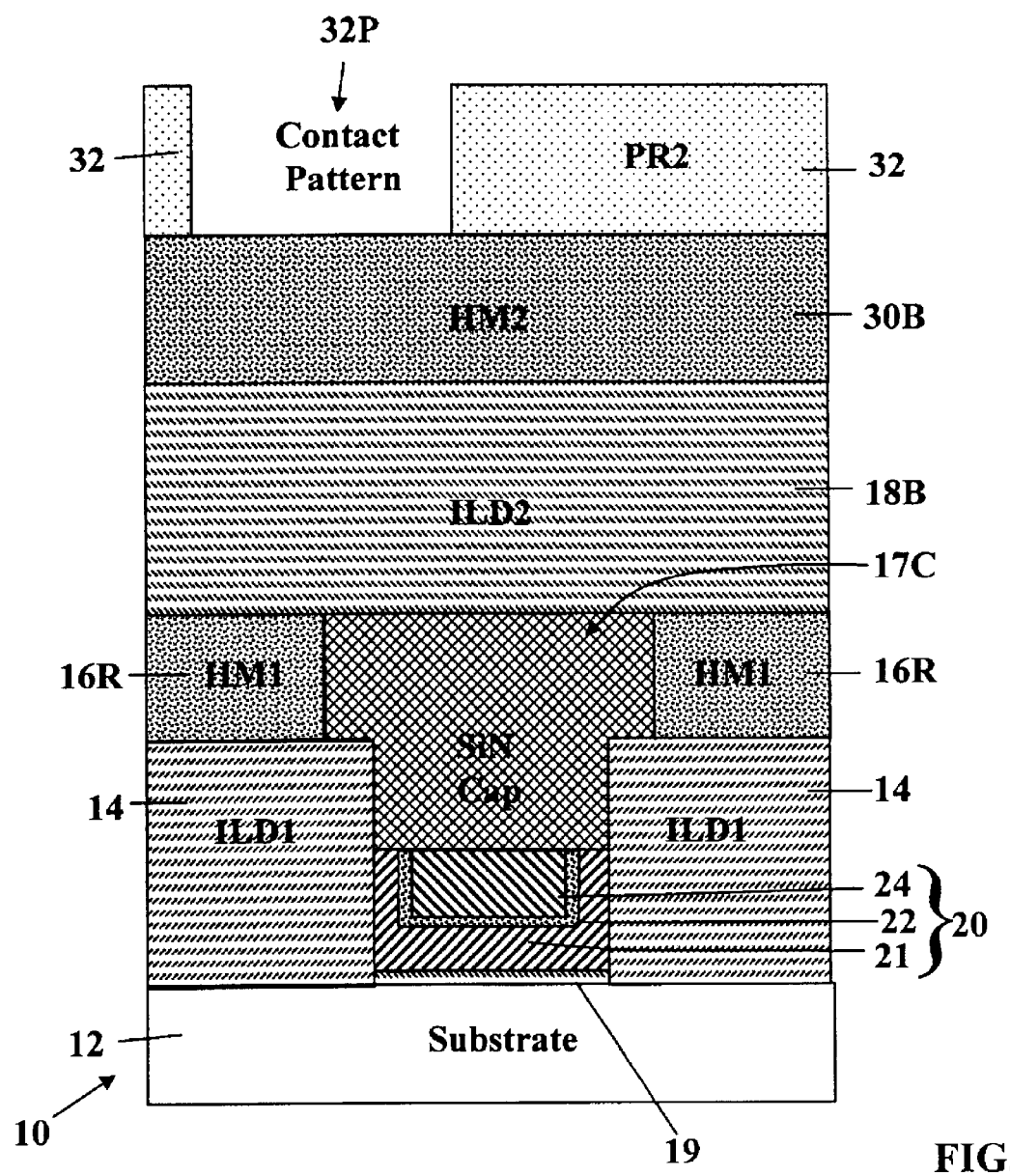
Figure 1L:
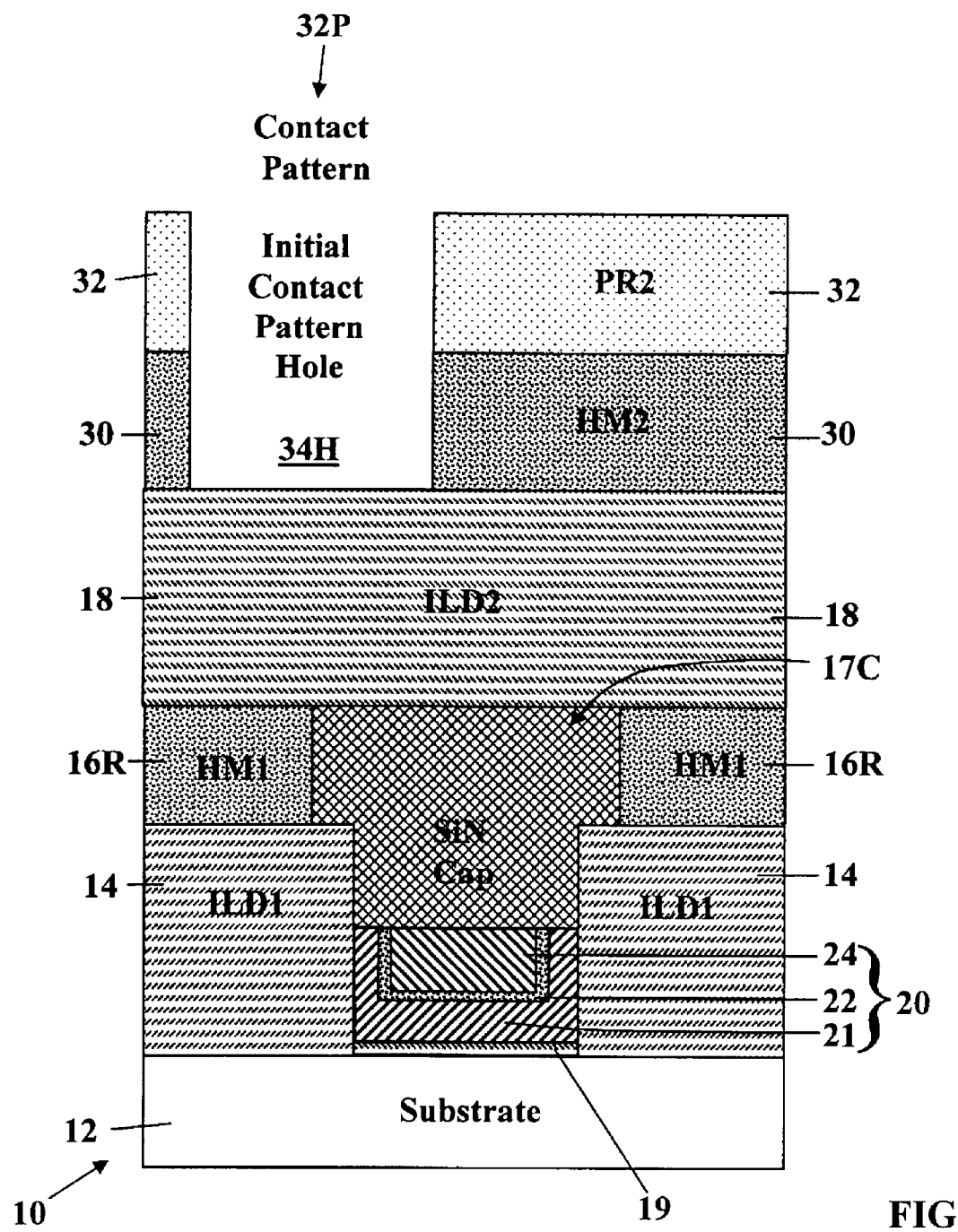
Figure 1M:
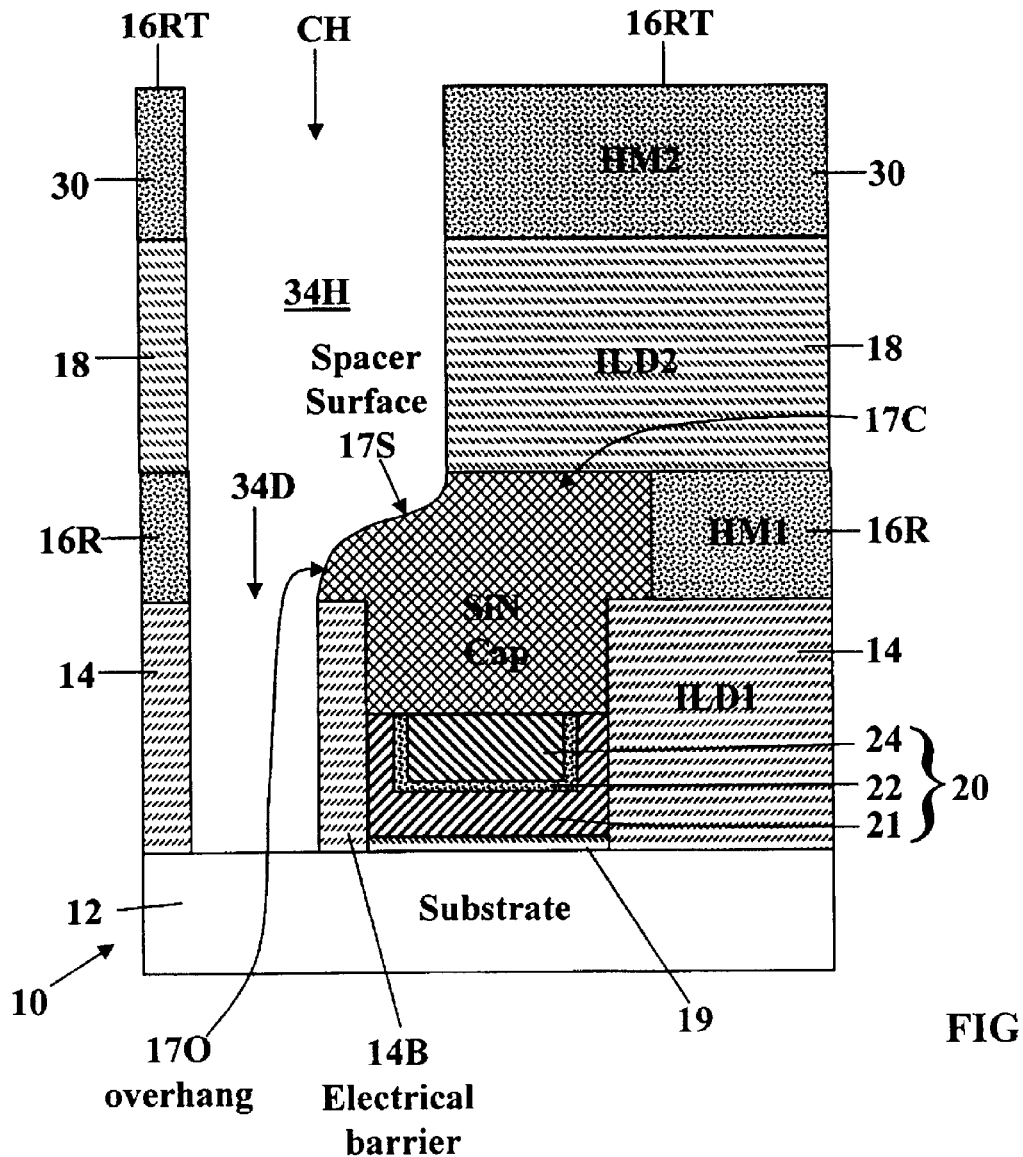
Figure 1N:
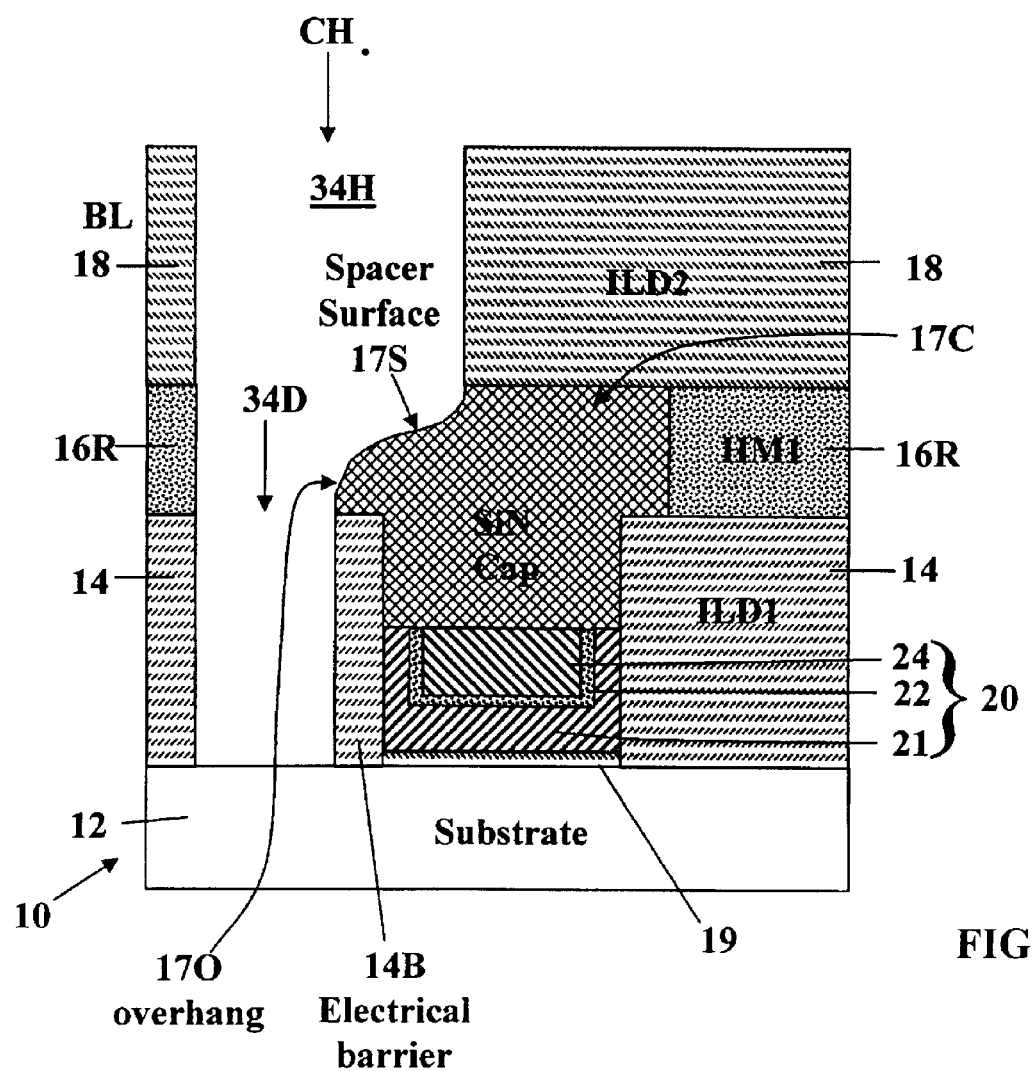
Figure 1O:
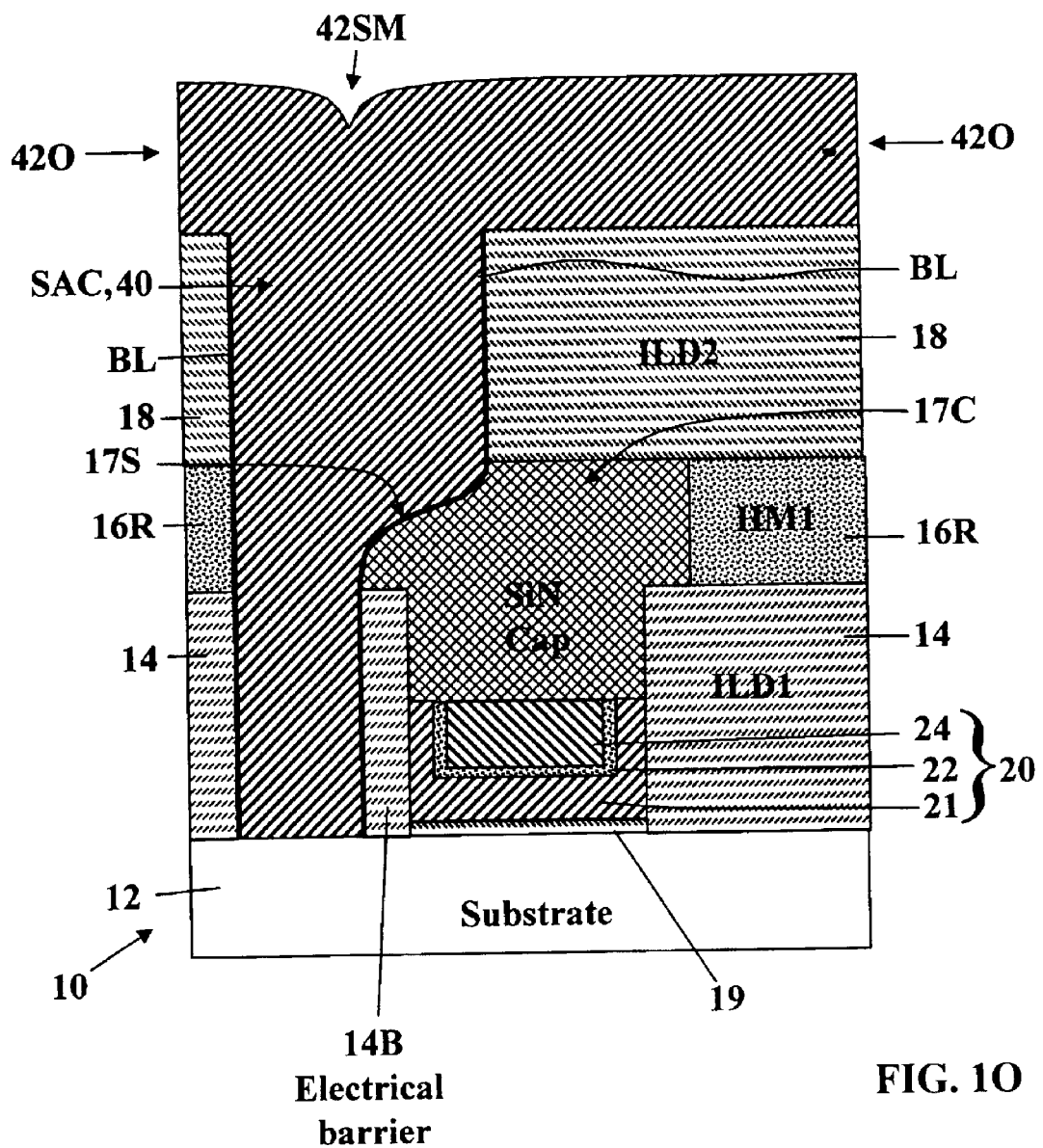
Figure 1P:
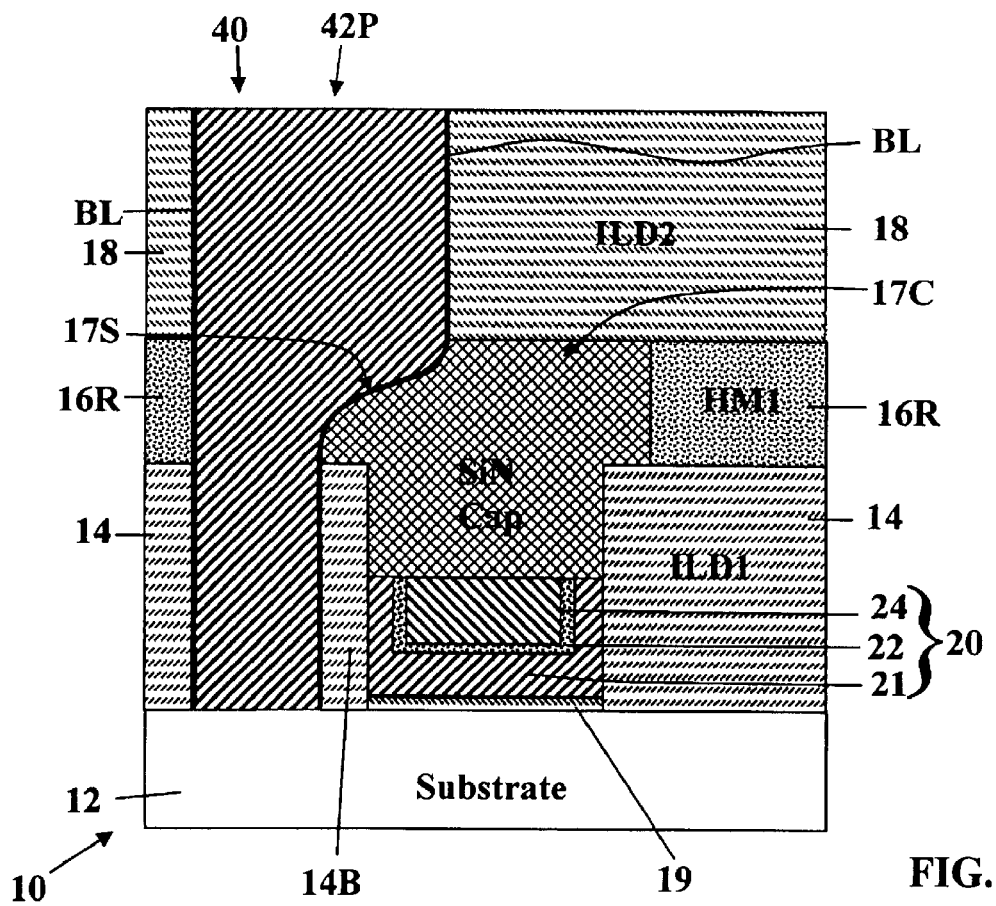
Figure 1C:
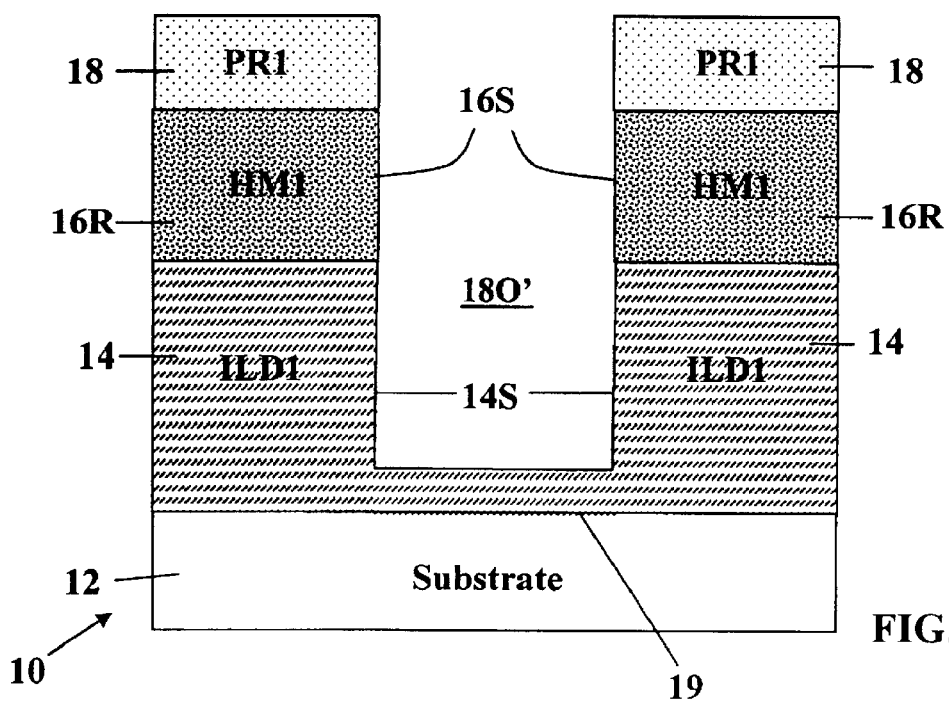

FIGS. 1A–1P show a series of processing steps in accordance with this invention for formation of a SAC next to a conductor line, separated therefrom by a conductor cap.

Figure 2:
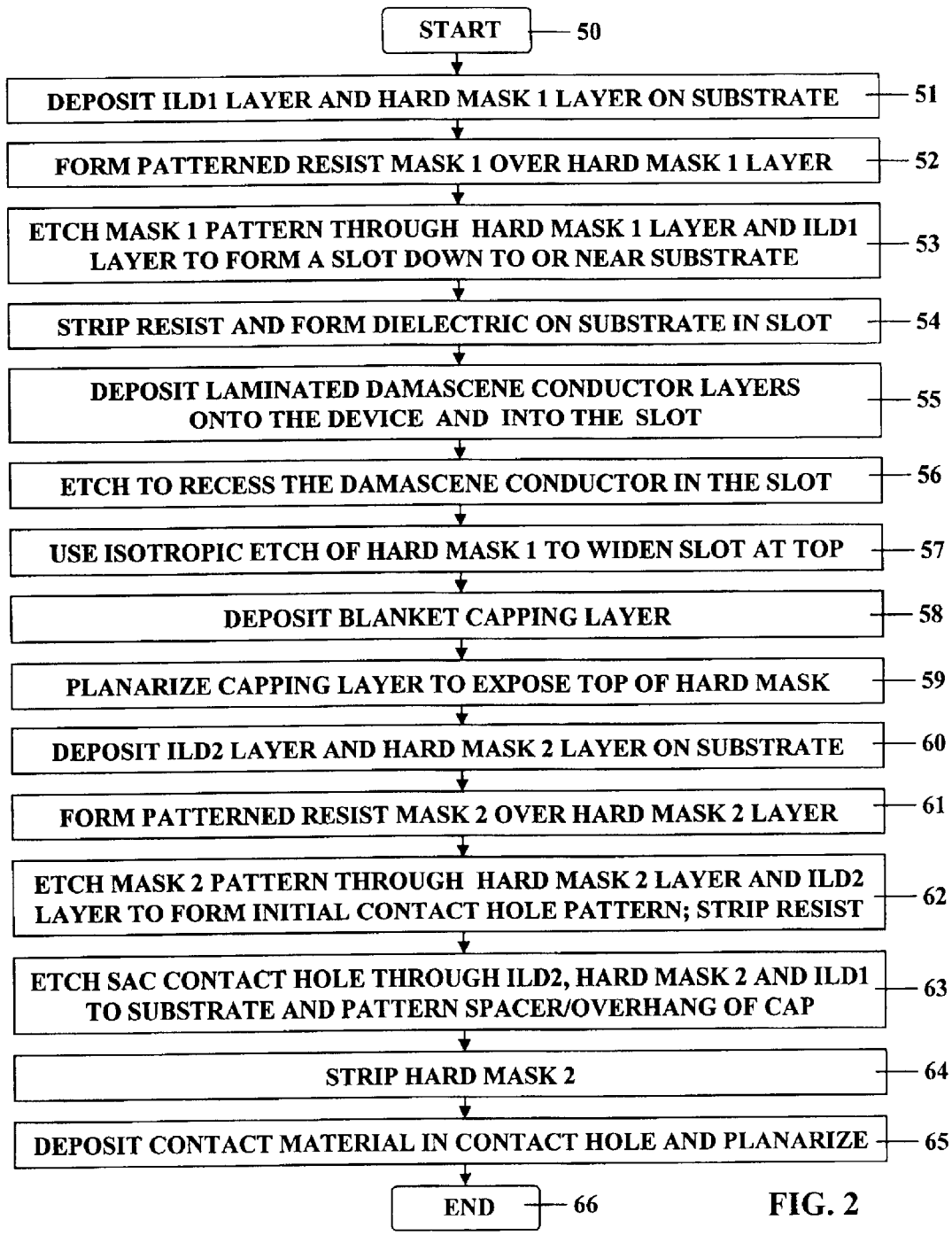
FIG. 2 is a flow chart listing the process steps illustrated in FIGS. 1A–1P.

FIG. 1P shows and embodiment of the device 10 made by the method of this invention, formed on a substrate 12 which is preferably composed of a semiconductor such as silicon. The device 10 includes a SAC 40 adjacent to a damascene conductor line 20. SAC 40 is separated from the conductor line 20 by a conductor cap 17C composed of a dielectric and a first InterLayer Dielectric (ILD) ILD1 layer 14. The conductor cap 17C which the is formed in an ILD1 layer 14 and a hard mask layer 16R and above the conductor line 20 has a smooth, tapered spacer surface 17S (preferably without corners) in contact with the SAC 40. FIG. 2 shows a process flow chart of the method of FIGS. 1A–1P starting at step 50 and ending at step 66.

Initial stages of the manufacture of the device 10 in accordance with this invention are illustrated by FIG. 1A which shows the device 10, which is formed on a semiconductor substrate 12, in accordance with step 51 in the flow chart shown in FIG. 2. A blanket, first Interlayer Dielectric (ILD1) layer 14B is formed on the top surface of the substrate 12 and a blanket first hard mask (HM1) layer 16B is formed above the ILD1 layer 14. The material of the blanket HM1 layer 16B has etch selectivity relative to the material of the ILD1 layer 14B. Preferably the ILD1 layer 14B is composed of a low k dielectric material such as comprises High Density Plasma (HDP) silicon oxide.

To form the HM1 hard mask layer 16B, a Low Pressure Chemical Vapor Deposition (LPCVD) process can be used to decompose TetraEthylOrthoSilicate (TEOS) gas forming the TEOS dielectric blanket. Alternatively, to form the HM1 hard mask layer 16B, the material of the blanket HM1 layer 16B can also comprise a BoroPhosphoSilicateGlass (BSPG) layer or a BoroSilicateGlass (BSG) layer.

FIG. 1B shows the device 10 of FIG. 1A after a photoresist (PR1) mask 18 was formed over the blanket HM1 layer 16B with a central window 18P forming an opening through the photoresist (PR1) mask 18 extending down to the surface of the HM1 layer 16B, in accordance with step 52 in FIG. 2.

FIG. 1C shows the device 10 of FIG. 1B after a slot 180 for a conductor line has been etched to through extend down through the HM1 layer 16B and the ILD1 layer 14B. The slot can extend through the ILD1 layer 14B to expose the top surface of the substrate 12, in accordance with step 53 in FIG. 2. It may be shallower as explained below with respect to slot 180 in FIG. 1D. In the either case, the slot 180 or slot 180 is preferably formed by dry etching through the central window 18P in the mask 18, preferably employing a carbon fluoride based etchant using a generic RIE tool. The result is that the HM1 layer 16B has been patterned into a HM1 hard mask 16 with HM1 sidewalls 16S defining the upper portion of the slot 180 and the blanket ILD1 layer 14B has been formed into ILD1 layer 14 that has been patterned with ILD1 sidewalls 14S defining the lower portion of the slot 180 for the conductor line. FIG. 1C' shows the result of forming a shallower slot for the conductor line in a first dielectric layer as an alternative result of the process step of FIG. 1C. In the modified process shown in FIG. 1C' (which drawing can be found below FIG. 1P with) shows the result of forming a shallower slot 180' in place of the deeper slot 180 in; FIG. 1C. In FIG. 1C' the shallower slot 180' extends to deep within the ILD1 layer 14B, but leaves a strip of the ILD1 layer 14 therebelow for separation of the conductor 20 to be formed in the slot 180' from the substrate 12.

FIG. 1D shows the device 10 of FIG. 1C after the photoresist mask 18 has been stripped therefrom, exposing the top surfaces 16T of the HM1 hard mask 16, in accordance with step 54 in FIG. 2.

FIG. 1E shows the device 10 of FIG. 1D after an optional step of formation of a dielectric layer 19 such as silicon oxide (similar to a gate oxide layer) over the exposed surface of the substrate 12 at the bottom of the conductor line slot 180, further in accordance with step 54 in FIG. 2. This is not necessary if the slot 180 does not reach down to the substrate 12, since the ILD1 layer 14 provides a dielectric layer which can prevent the conductor to be form in the slot 180 from short circuiting to the substrate 12.

If we want to use the damascene conductor as an interconnection line rather than gate conductor, this dielectric formation step will be skipped because the interconnection line should be used to contact to a storage node or a contact node. For example, the word line of a vertical DRAM, a bit line for a stack DRAM with a capacitor over a bit line, and a high density interconnection line for a BEOL have no gate dielectric under the damascene conductor.

Formation of Damascene Conductor

Next in accordance with step 55, follow a sequence of deposition steps directed to forming the damascene conductor line 20. The sequence involves the blanket deposition of a set three laminated, blanket conductor layers 20B including layers 21, 22 and 24 over the device filling the conductor line slot 180 and covering the top surfaces 16T of the HM1 hard mask 16. The dielectric layer 19, which may be a layer of silicon oxide such as a gate oxide layer, isolates the blanket conductor layers 20B from the substrate 12 to prevent a short circuit to the substrate 12. The dielectric layer 19 is formed in a conventional manner, as will be well understood by those skilled in the art.

First a thin blanket, conformal doped polysilicon conductor layer 21 having a thickness of about 30 nm to about 100 nm is formed on the exposed surface of the substrate 12 at the bottom of the slot 180, on the sidewalls of the patterned ILD1 layer 14 in slot 180 and the sidewalls of HM1 hard mask 16 in slot 180 in FIG. 1D, and on the top surface of the HM1 hard mask 16 leaving substantial space in the slot 180 for the layers 22 and 24 to be deposited subsequently.

Next an even thinner, blanket, conformal barrier metal layer 22 composed of a barrier metal such as TiN, with a thickness below 10 nm is formed over the exposed surfaces of the polysilicon conductor layer 21, also leaving substantial space in the slot 180 for the final layer 24 of the blanket conductor layers 20B that is to be deposited later.

Then a blanket metal layer 24, such as W, having a thickness of about 30 nm to about 100 nm is formed over the barrier metal layer 22 overfilling the remaining space in the slot 180 completing the three laminated, blanket conductor layers 20. W can be deposited using Physical Vapor Deposition (PVD)

FIG. 1F shows the device 10 of FIG. 1E after etching in accordance with the step 56 of FIG. 2 has been performed to recess the blanket conductor layers 20B to form the laminated damascene conductor 20. The three laminated, blanket conductor layers 20 have been etched back down well below the top surface of the HM1 hard mask layer 16 to form the laminated damascene conductor 20 with top surfaces of all three layers 21, 22 and 24 exposed at the bottom of a cap hole 18C which comprises the space in slot 18) which remains open, i.e. hollow, above the conductor 20, at this point in the process.

The blanket conductor layers 20B are etched back using Chemical Mechanical Planarization/Polishing (CMP) followed by an isotropic etch. Preferably, the isotropic etch is performed using a Reactive Ion Etching (RIE) process employing with a $Cl_2$ or $NF_3$ based reactive gas as the etchant. The sidewalls 16S of the HM1 hard mask 16 are exposed and upper surfaces of the ILD1 sidewalls 14S are exposed above conductor 20.

FIG. 1G shows the device 10 of FIG. 1F after isotropic etching of HM1 hard mask 16 in accordance with the step 57 of FIG. 2 formation of a recessed HM1 hard mask 16R that forms a wider mouth 18M to the cap hole 18C by an isotropic etching process. The result of the isotropic etching step is that top surfaces 16T of the HM1 hard mask 16 have been lowered by the etching and the sidewalls 16S of the HM1 hard mask 16 have been etched back laterally, widening and lowering the cap hole 18C. In particular, the HM1 hard mask 16R is recessed with lowered top surfaces 16RT and the sidewalls are laterally recessed forming sidewalls 16RS, as indicated by the phantom lines. The result is that the HM1 hard mask 16R, is laterally and vertically recessed at the mouth at the top of the cap hole 18C, so that the cap hole mouth 18M is wider than the lower portions of the cap hole 18C as a result of the isotropic etching. Preferably, the isotropic etching process employs an etchant such as HF or HF EG which etches the material of the HM1 hard mask layer 16 about five times the rate of etching of the material of the patterned ILD1 layer 14.

FIG. 1H shows the device 10 of FIG. 1G after the first part of step 58 in FIG. 2 of depositing a blanket capping layer 17, which overhangs the ILD1 layer because the cap hole mouth 18M was widened. The blanket capping layer 17 is composed of a dielectric material onto the device 10 overfilling the cap hole 18C and reaching above the cap mouth 18M. In other words, the cap hole 18C and the cap hole mouth 18M have been filled with a blanket conductor cap layer 17 covering the top surface of the conductor 20 including the exposed edges of all three layers 21, 22 and 24, the exposed surfaces of the patterned ILD1 layer 14, and the exposed surfaces 16RT and 16RS of the recessed HM1 hard mask 16R. The blanket conductor cap layer 17 is preferably composed of a dielectric such as silicon nitride ($Si_3N_4$ referred to hereinafter as SiN).

FIG. 1I shows the device 10 of FIG. 1H after planarization to remove the excess thickness of the conductor cap layer 17 in accordance with step 59 in FIG. 2 with the conductor cap 17C remaining above the conductor 20 having its top surface level with the top surface of the HM1 hard mask 16R, which is exposed by the planarization. The planarization is preferably performed by a CMP process using normal pads and slurries. The CMP process ends using an end point detector activated by detection of an oxide signal upon exposure of the top surface of the oxide in the recessed HM1 hard mask layer 16R, composed of glass materials such as TEOS, BPSG, or BSG as described above.

FIG. 1J shows the device 10 of FIG. 1I after forming a blanket second InterLayer Dielectric (ILD) ILD2 layer 18B which is composed of a low k dielectric material such as CVD silicon oxide, BSPG, or HDP silicon oxide in accordance with step 60 in FIG. 2.

FIG. 1K shows the device 10 of FIG. 1J after formation of both a blanket second HM2 hard mask layer 30B and a photoresist mask 32 over the blanket ILD2 layer 18B in accordance with steps 60 and 61 in FIG. 2.

The HM2 hard mask layer 30B, which is deposited in accordance with step 60 in FIG. 2, is composed of a material which has a high etch selectivity relative to the blanket ILD2 layer 18B and the material of the cap nitride 17C.

The HM2 hard mask layer 30B may be an ARC (Anti-Reflective Coating) material and a suitable hard mask material such as TERA (Tunable Etch-Resistant ARC), which is described in commonly-assigned, copending U.S. published patent application 20040053504 of Wise et al. for "In-situ Plasma Etch for TERA Hard Mask Materials". See also commonly-assigned, copending U.S. patent application Ser. No. 10/249,047 of Deshpande et al. entitled "Hard Mask Integrated Etch Process for Patterning of Silicon Oxide and Other Dielectric Materials".

Formation of the blanket second HM2 hard mask layer 30B is followed by forming the second photoresist PR2 mask 32, in accordance with step 61 in FIG. 2, with an open contact pattern window 32P therethrough over the blanket ILD2 layer 18B centered above the vertical interface between the recessed HM1 hard mask 16R and the conductor cap 17C.

FIG. 1L shows the device 10 of FIG. 1K after performing step 62 in FIG. 2 of anisotropic etching to form an initial contact hole pattern comprising a portion of an upper contact hole 34H down through the blanket second HM2 hard mask layer 30B forming a hard mask 30 extending down below the contact pattern window 32P to the top surface of the blanket ILD2 layer 18B. Preferably a carbon fluoride based dry etchant is employed in a conventional dry etching tool with a time range dependent upon the thickness of the blanket second HM2 hard mask layer 30B, with a pressure in the range from about 10 mTorr to about 1000 mTorr. The result is that the second HM2 hard mask layer 30B has been formed into an HM2 hard mask After the second HM2 hard mask layer 30B has been etched, the photoresist PR2 mask 32 should be stripped.

FIG. 1M shows the device 10 of FIG. 1L after deepening the contact pattern hole 34H followed by completion of the formation of a SAC contact hole CH according to step 63 including forming the SAC contact pattern hole 34H and forming a deep contact pattern hole 34D below the contact pattern hole 34H As shown in FIG. 1M, the HM2 hard mask 30 has been used to deepen the upper contact hole 34H down through the blanket second ILD2 layer 18B thereby forming a patterned second ILD2 layer 18, which is used to form SAC contact hole CH and deep contact pattern hole 34D.

The deep contact pattern hole 34D, which is located below the upper contact hole 34H, is spaced to the left of the conductor 20 by an electrical barrier 14B formed from a portion of the patterned ILD1 layer 14, remaining after forming the contact pattern hole 34D.

The deep contact pattern hole 34D is formed by slowly isotropically etching by access from contact hole 34H through some of the conductor cap 17C while rapidly anisotropically etching the patterned ILD1 layer 14 aside from the conductor 20 down to the top surface of the substrate 12, leaving vertical sidewalls in the recessed HM1 hard mask 16R and the patterned ILD1 layer 14. As a result, a smoothly profiled spacer surface 17S on the upper left of the conductor cap 17C is formed well above the conductor 20. The deep contact pattern hole 34D below the contact pattern hole 34H is formed in the same way that the usual hole is formed in a SAC process or a borderless contact process; but in this case, the SAC process has a very high etch selectivity between the conductor cap layer 17 (preferably composed of SiN) on the one hand and the combined recessed HM1 hard mask 16R and the patterned ILD1 layer 14/ILD2 layer 18 on the other hand.

The portion of the deep contact pattern hole 34D below the level of the recessed HM1 hard mask 16R has vertical sidewalls on all sides of pattern hole 34D formed in the patterned ILD1 layer 14. An electrical barrier 14B is formed by the portion of the patterned ILD1 layer 14 between the conductor 20 and the deep contact pattern hole 34D. Because the etchant is selective to the material of the conductor cap 17C which has a very slow etching rate the result is that there is isotropic etching of the exposed surfaces of the conductor cap 17C. The slow etching rate produces a tapered exposed surface 17S of the contact cap below the contact pattern hole 34H. The result is that an overhang portion 17O of the conductor cap 17C remains above the electrical barrier portion 14B of the patterned ILD1 layer 14 between the deep contact pattern hole 34D and the conductor 20.

FIG. 1N shows the device 10 of FIG. 1M after performing step 64 of FIG. 2 of stripping the HM2 hard mask 30 from device 10. After the HM2 hard mask 30 has been stripped the top surface of the patterned ILD2 layer 18 is exposed. The preferred HM2 hard mask layer 18 which comprises a TERA material can be stripped with HF/EG (HydroFluoric acid solute in Ethylene Glycol solvent) based chemistry after a plasma treatment selective to oxide, nitride, polysilicon as described in copending, commonly assigned, U.S. patent application Ser. No. 10/709,514 filed 11 May 2004 (FIS9 2004 0058 US1) of Dureseti Chidambarrao et al. entitled "Methods and Structure of Protecting One Area While Processing the Other Area on a Chip".

Figure 10:
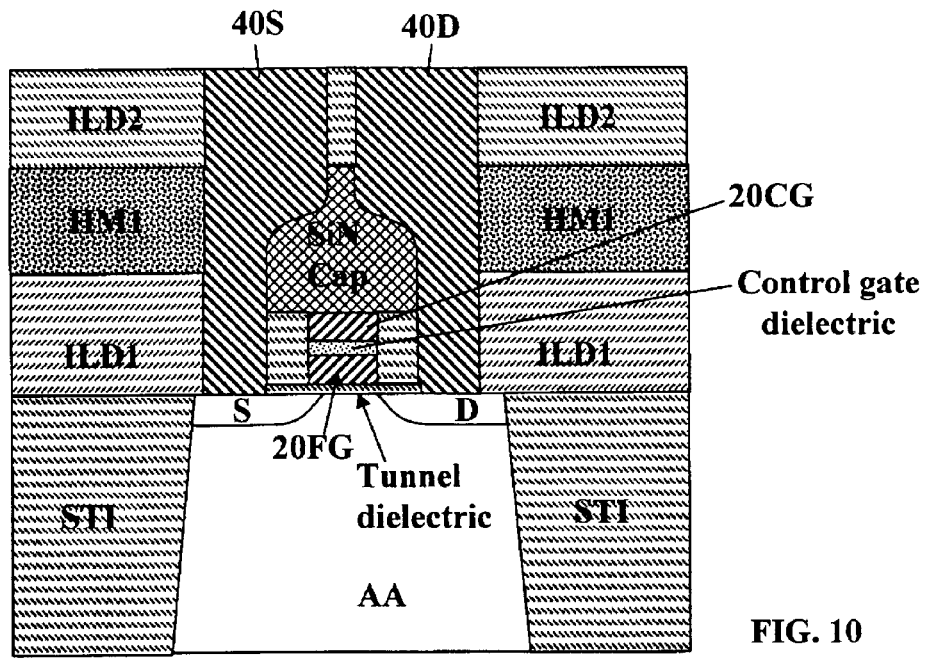
FIG. 10 shows an application of the present invention to an FET with conductors comprising a control gate and a floating gate and a source contact and a drain contact separated from the conductors by a single SiN cap.

FIG. 10 shows the device 10 of FIG. 1N after performing the initial portion of step 65 in FIG. 2 of forming the blanket metallization 420 of the SAC filling the contact hole CH deep contact pattern hole 34D and filling the contact pattern hole 34H and overfilling the hole 34H to cover the top surface of the patterned ILD2 layer 18. Referring to FIG. 1N, preparation for forming the blanket metallization 420 begins by precleaning to remove residual defects in the region of the contact hole CH comprising the deep contact pattern hole 34D and the contact pattern hole 34H to reduce the contact resistance between the contact and the substrate in accordance with processing steps well known to those skilled in the art.

Next a step of deposition of a thin barrier layer BL follows in which a thin titanium/titanium nitride (Ti/TiN) layer or the like is formed on the exposed sidewalls of the dielectrics as shown in FIG. 10 defining the contact hole CH including the patterned ILD1 layer 14, HM1 hard mask 16R, conductor cap 17C and ILD2 layer 18 in the contact hole CH. The barrier layer BL is formed to prevent possible reaction between the contact metal and the sidewall dielectrics of the contact hole CH. Next, a metal deposition step follows in which the SAC metal 40, preferably composed of tungsten (W), is deposited by Plasma Vapor Deposition (PVD) over the top of the contact hole CH producing an overplated region 420 of the SAC metal 40 extending above the top surface of the patterned ILD2 layer 18. Sometimes seams are produced during the plating process, such as seam SM shown in the center of the location of the former contact hole CH due to poor step coverage by the metal 40.

FIG. 1P shows the device 10 of FIG. 10 after performing the final portion of step 65 of planarizing to remove the overplated region 420 of the SAC metal 40 from the top of device 10 by using a CMP process. The process continues until an end point detector detects oxygen from the top surface of the patterned ILD2 layer 18. The planarization process continues briefly to remove slightly more metal along with a very thin layer of the patterned ILD layer 18 to prevent a contact short circuit which would be caused by residual metal located in local dished surfaces which may have been present on top of the patterned ILD2 layer 18, prior to deposition of the SAC metal 40.

The description of FIG. 1C' can be found above in connection following the description of FIG. 1C.

Silicide Conductor Process

Figure 3A:
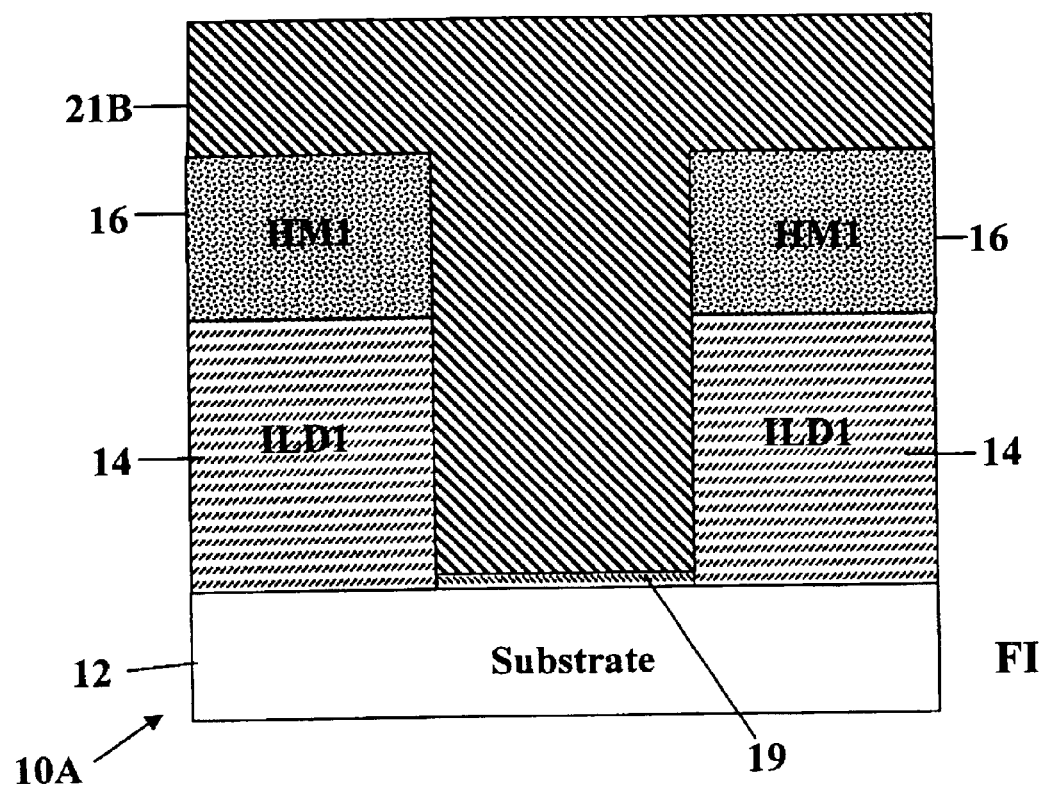
FIGS. 3A–3K illustrate modified steps of the process of FIGS. 1A–1P.
Figure 3B:
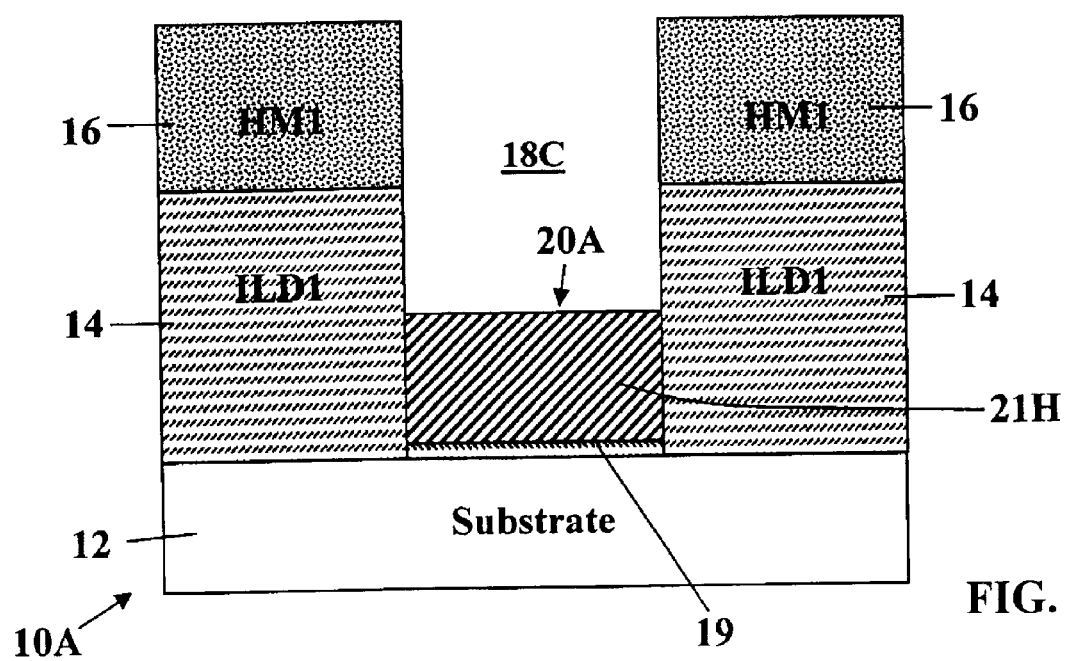
Figure 3C:
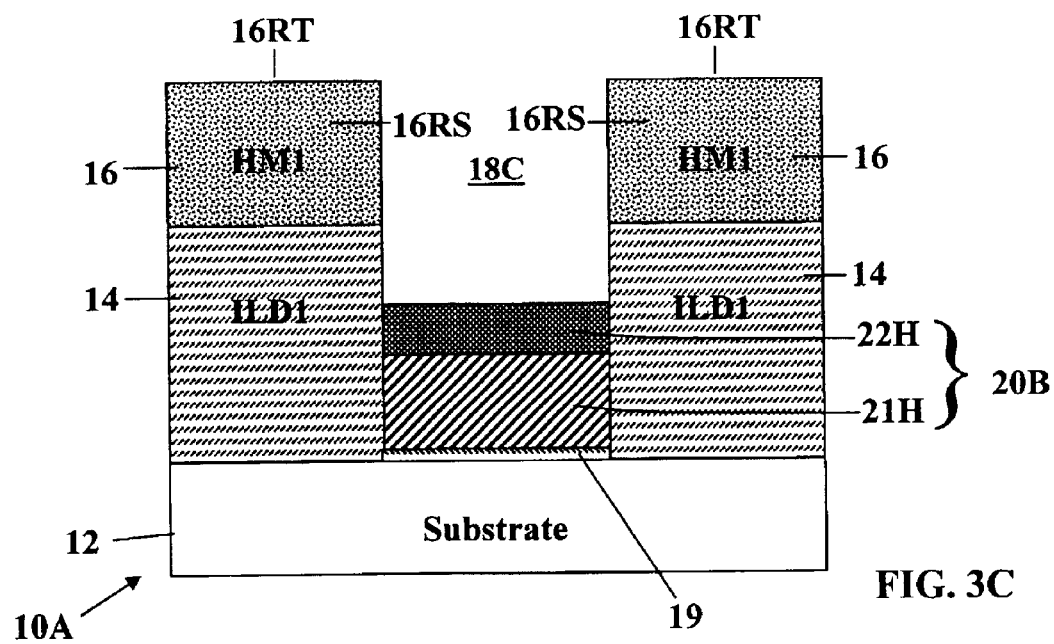
Figure 3D:
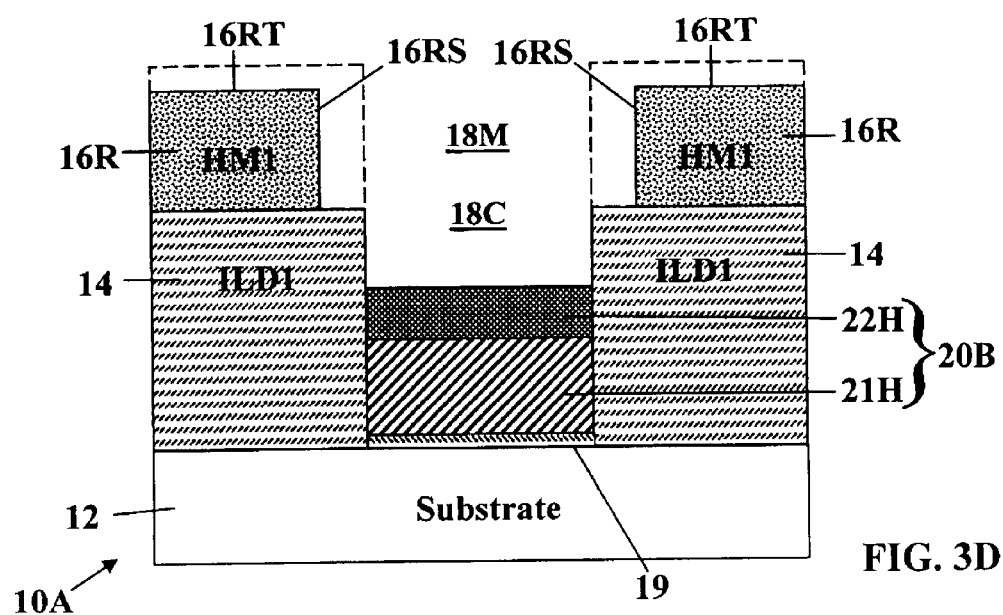
Figure 3E:
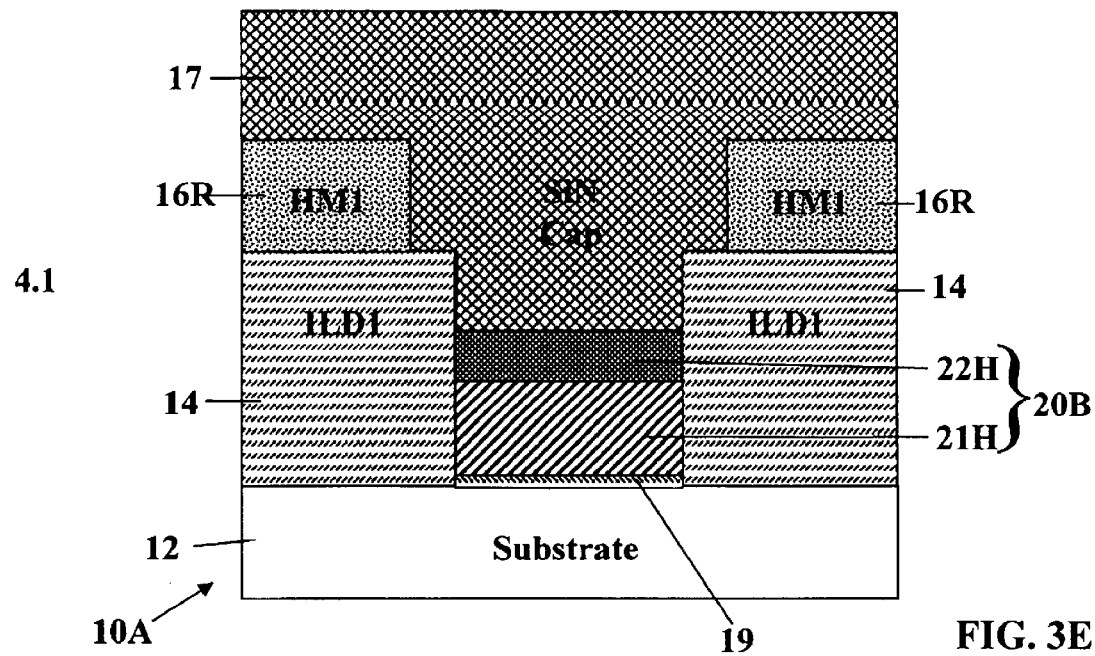
Figure 3F:
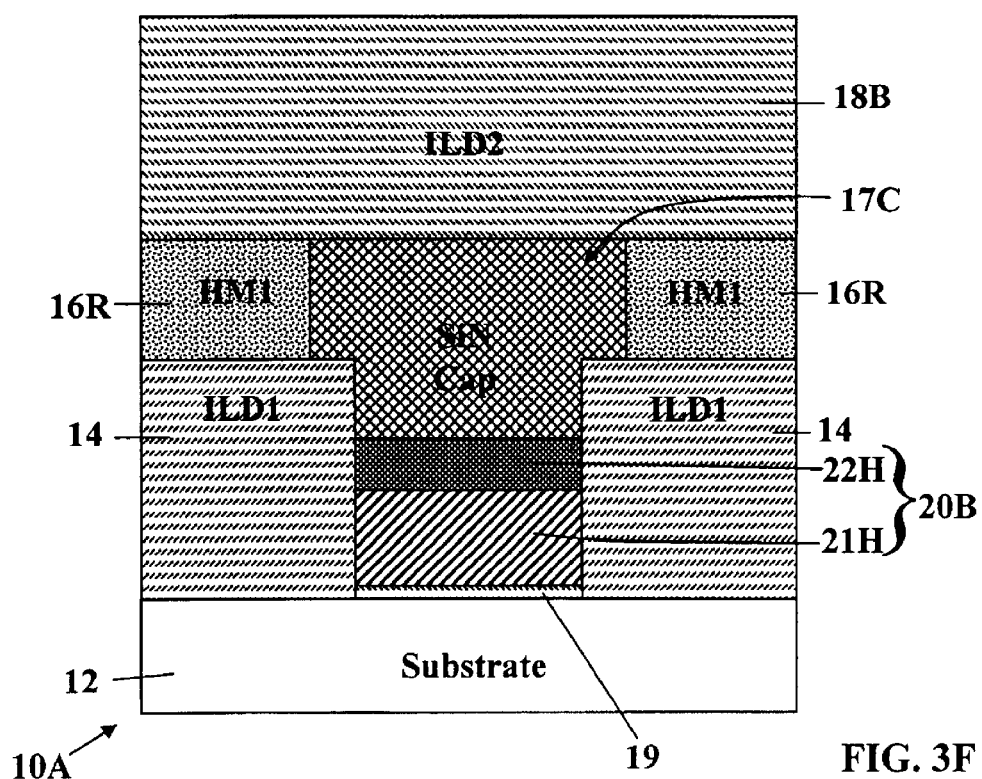
Figure 3G:
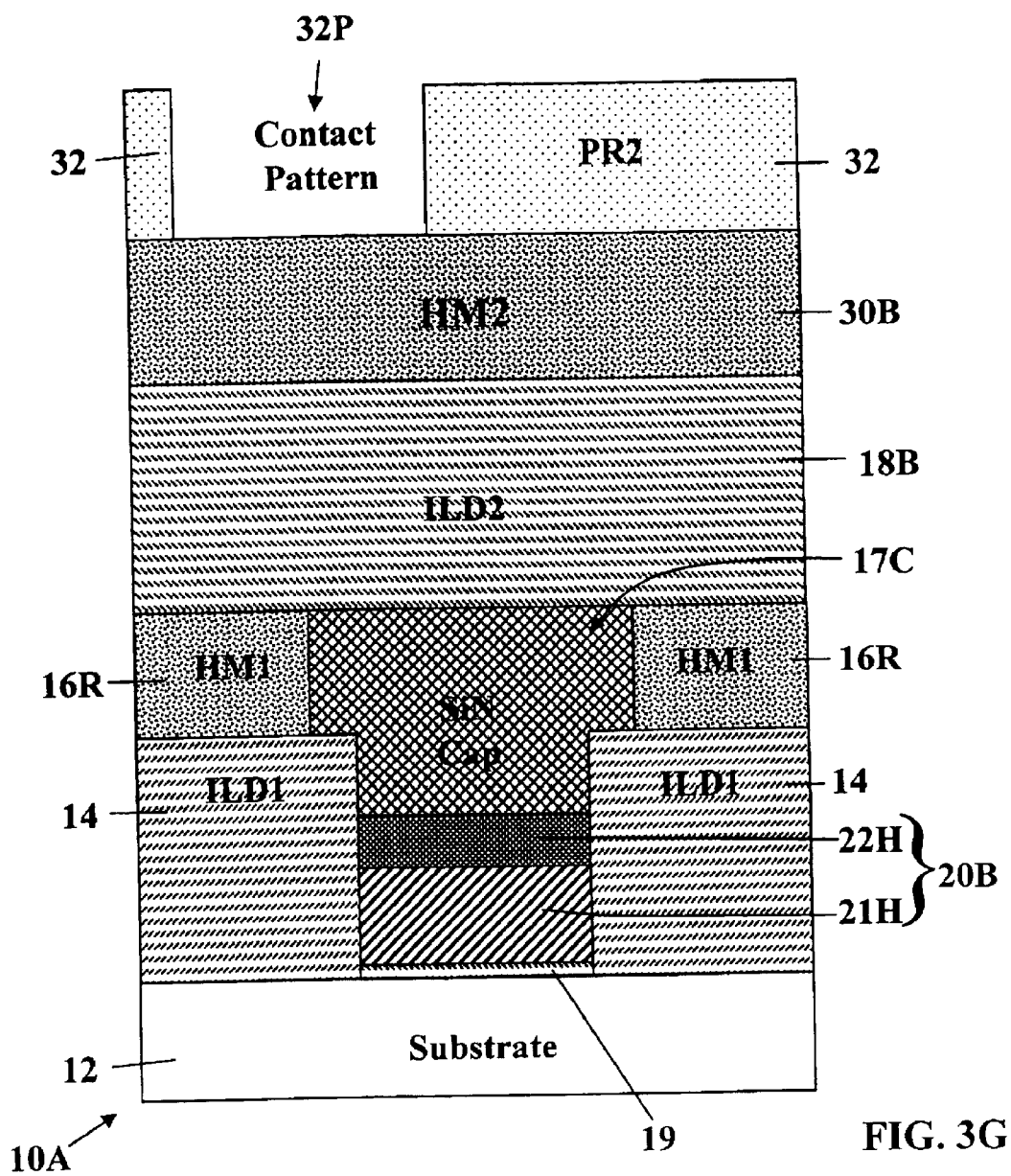
Figure 3H:
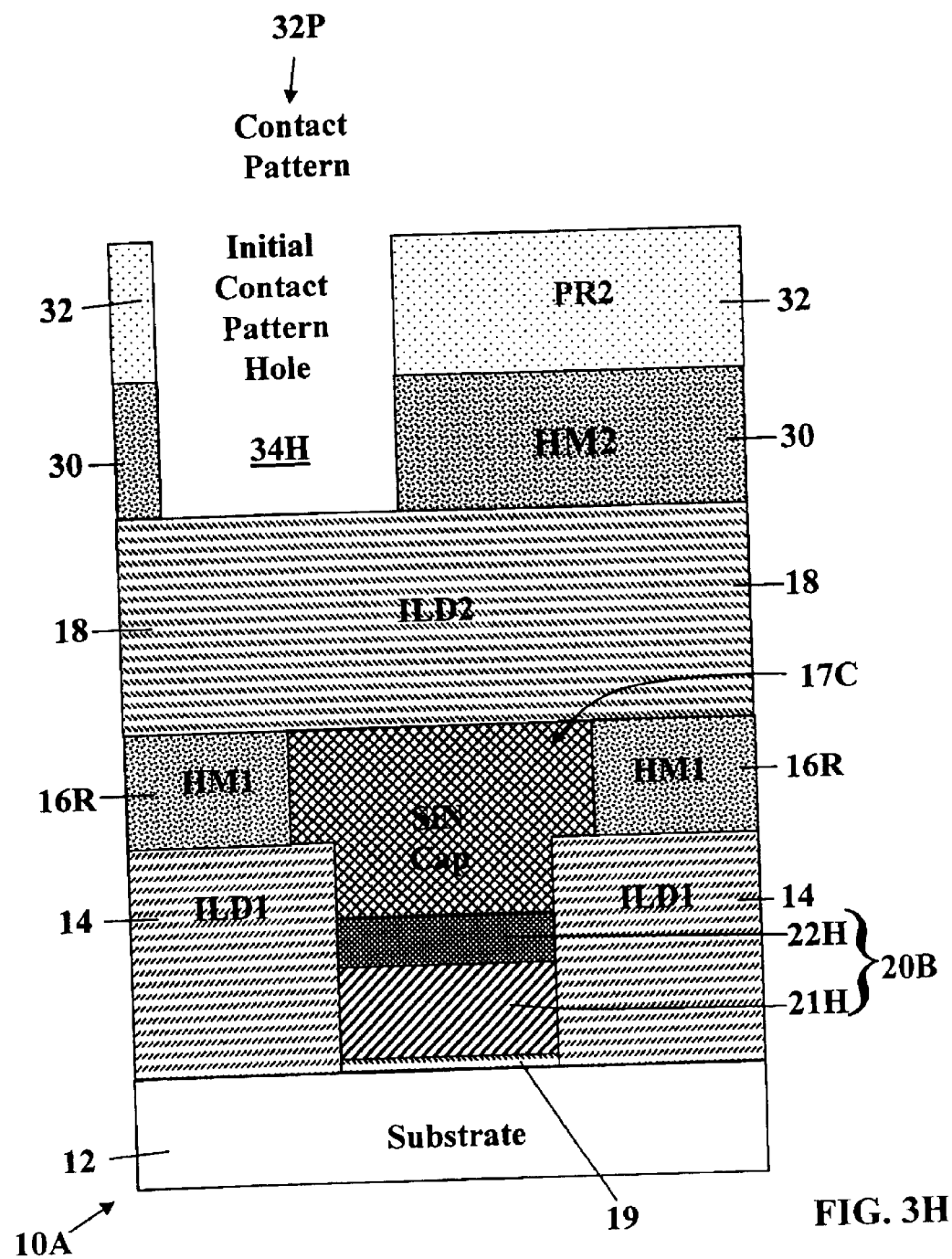
Figure 3I:
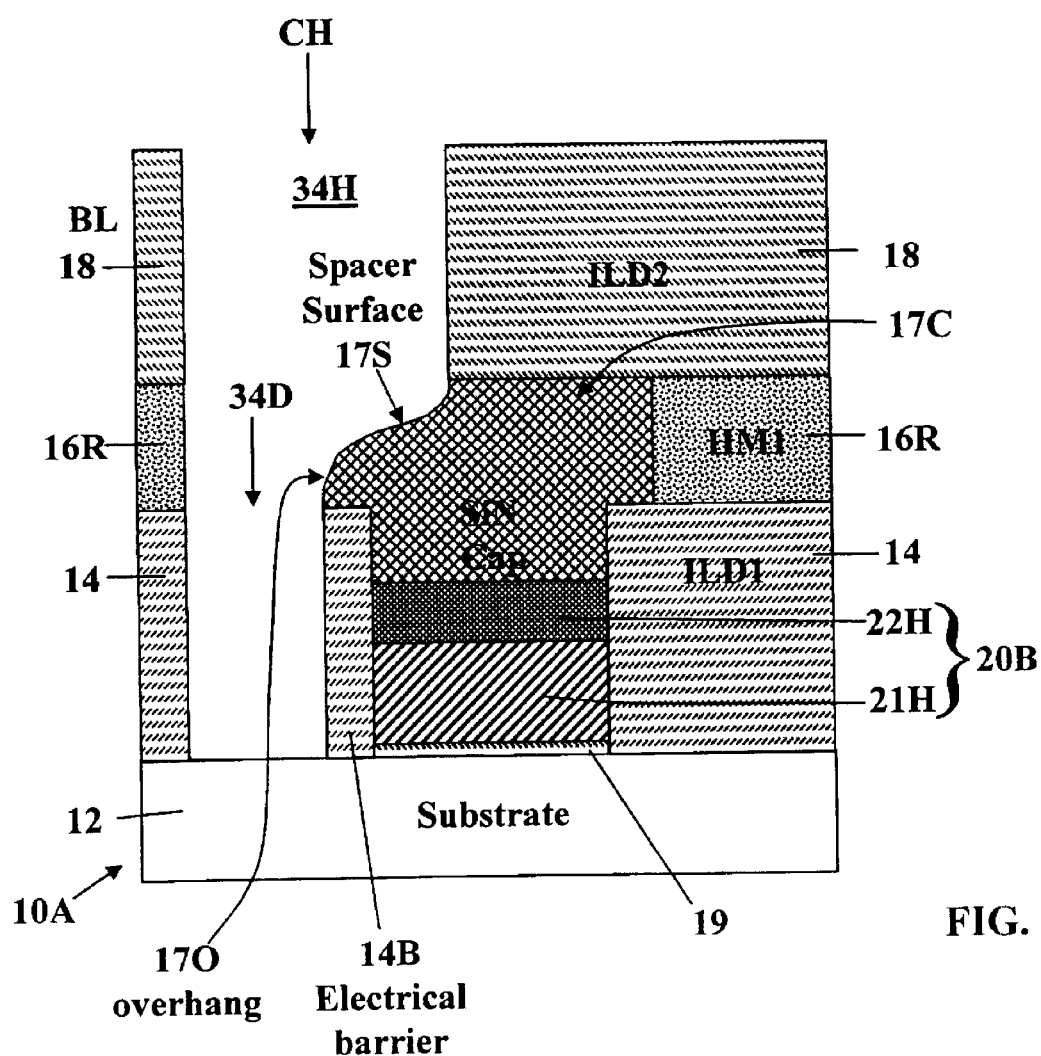
Figure 3J:
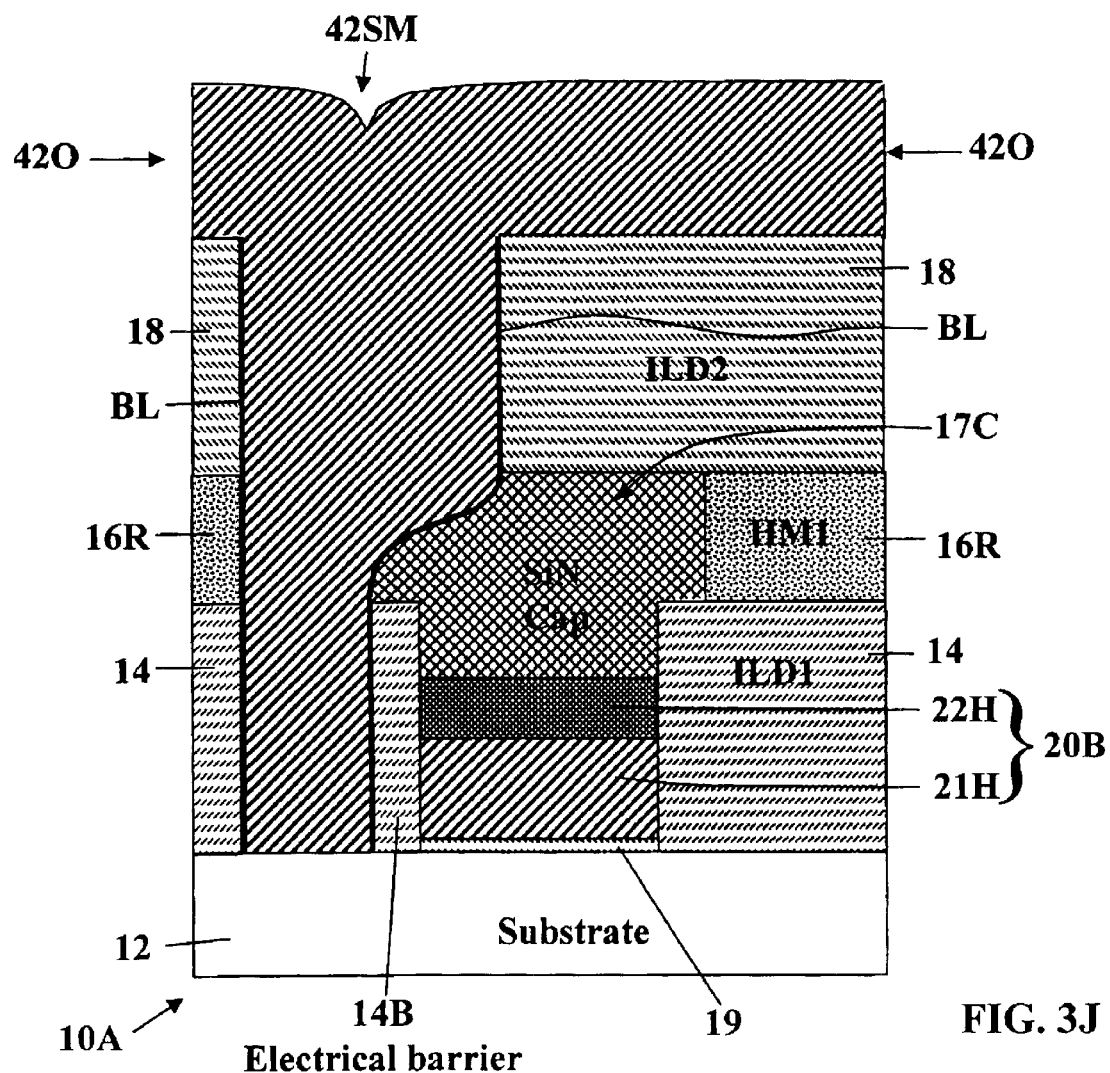
Figure 3K:
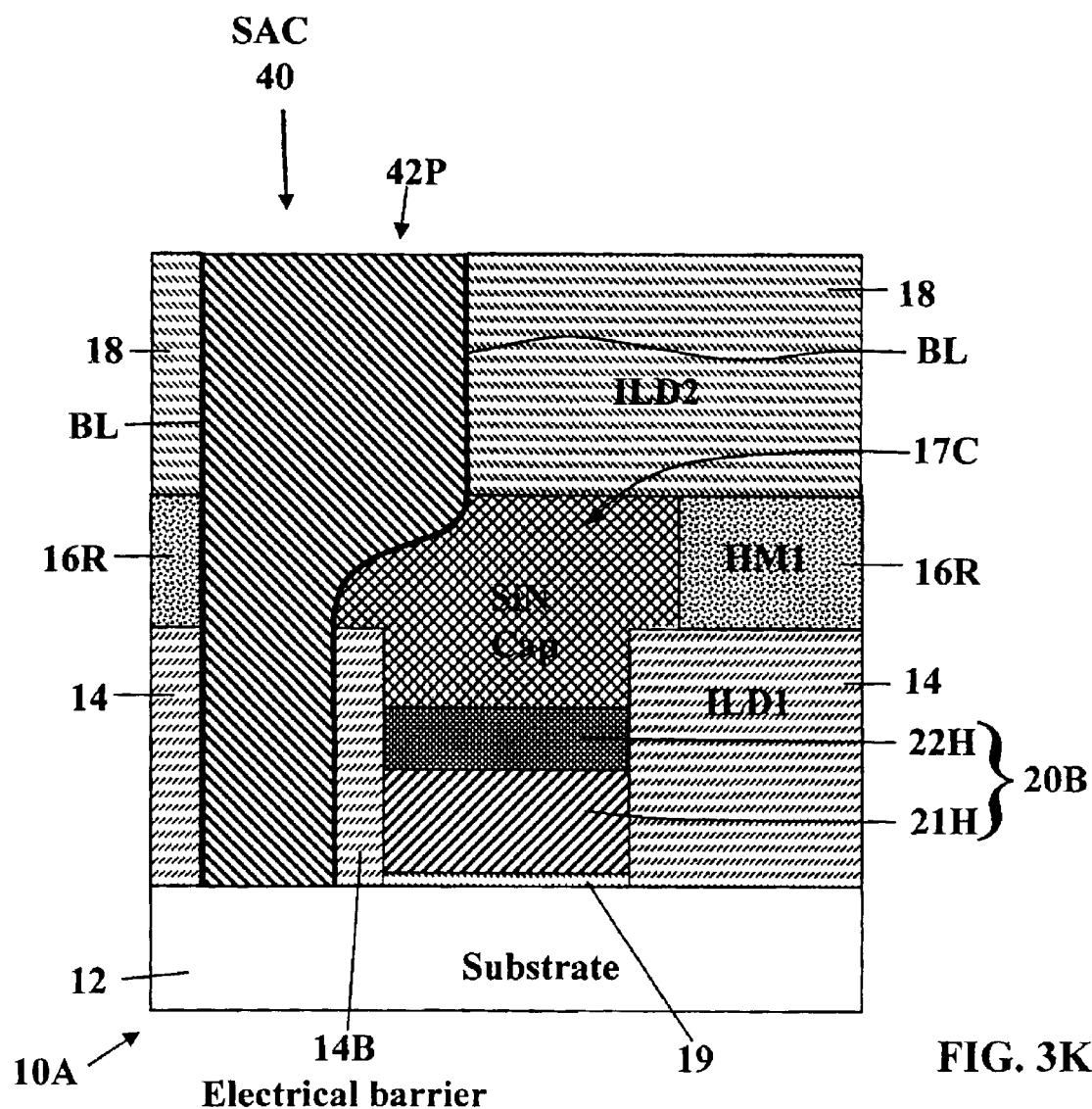
Figure 4:
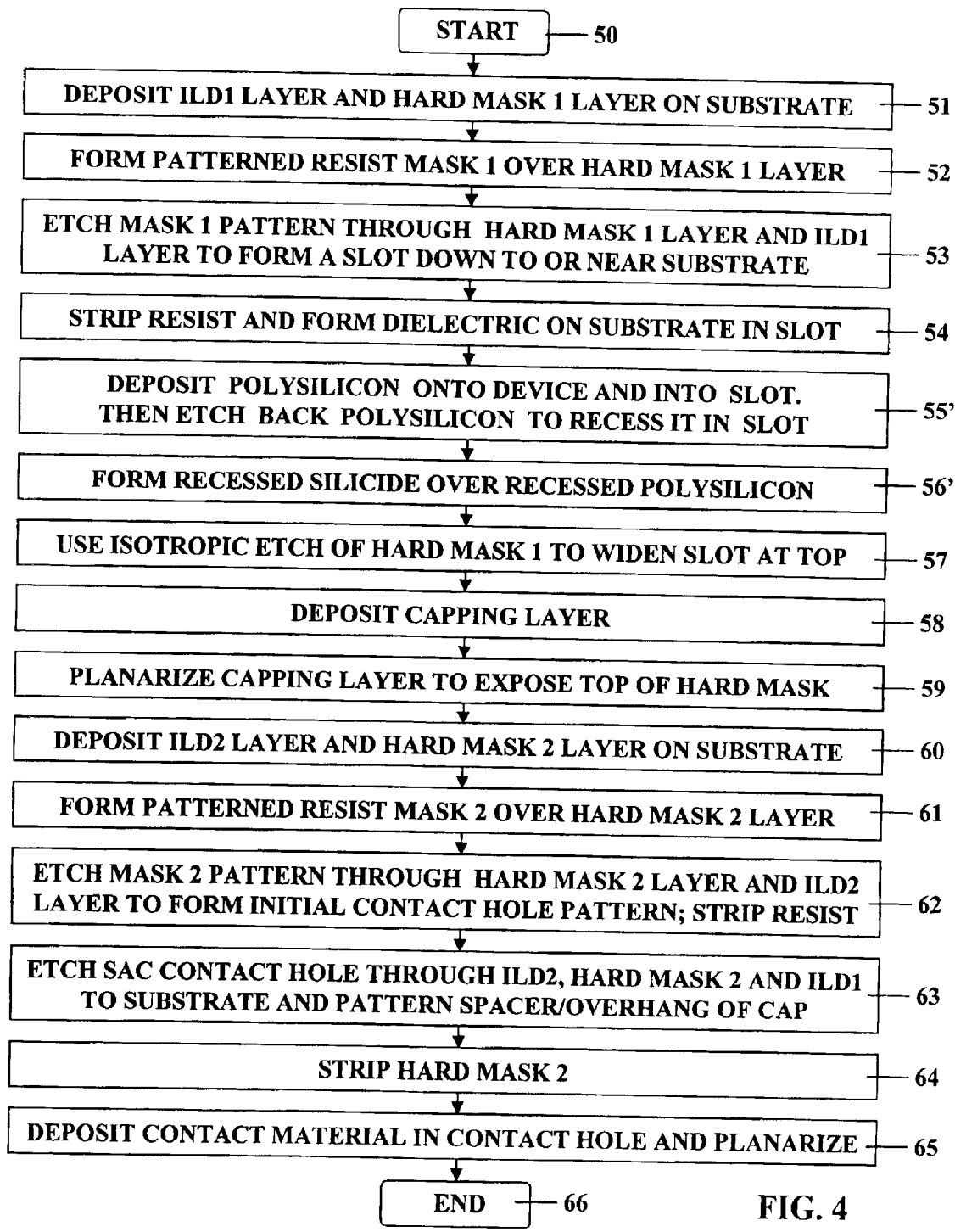
FIG. 4 is a flow chart listing the process steps illustrated in FIGS. 3A–3K.

FIGS. 3A–3K show steps in a process modified from the process of FIGS. 1A–1P in which the damascene conductor process has been replaced by a silicide conductor process incorporating FIGS. 1A–1D and steps 50–54 of FIG. 4, and starting with FIG. 3A as a modification of FIG. 1E.

As stated above, FIG. 3A is a modification of FIG. 1E, in accordance with step 55' in FIG. 4, in which a blanket polysilicon layer 21B is deposited over a device 10A, filling a conductor line slot 180 and covering a gate dielectric layer 19 at the bottom of the conductor line slot 180 and the top surface of a HM1 hard mask 16. The blanket polysilicon layer 21B has a thickness from about 300 nm to about 500 nm. As stated above in connection with FIG. 1E, the gate dielectric layer 19 is not necessary if slot 180 does not reach down to the substrate 12, since the ILD1 layer 14 provides a dielectric layer which can prevent the conductor to be formed in the slot 180 from short circuiting to the substrate 12.

FIG. 3B shows the device 10A of FIG. 3A, in accordance with the secondary portion of step 55' in FIG. 4, after a blanket etch using a generic RIE tool to reduce the thickness of the blanket polysilicon layer 21B to from about 50 nm to about 150 nm forming a polysilicon conductor 21H above the gate dielectric layer 19, leaving the remainder of the cap hole 18C open. The layer 21H comprises a preliminary polysilicon conductor 20A which is prepared for being covered with a silicide layer to form the silicide conductor 20B shown in FIG. 3C.

FIG. 3C shows the device 10A of FIG. 3B, in accordance with step 56' of FIG. 4, after a conventional process of silicidation to complete the silicide conductor 20B with a silicide layer 22H formed above the polysilicon layer 21H. The silicide layer 22H preferably has a thickness from about 30 nm to about 100 nm. Then after silicidation, any excess metal remaining above the silicide layer 22H is removed.

FIG. 3D shows the device 10A of FIG. 3C after the step 57 of FIG. 4 of isotropic etching of the HM1 hard mask 16 to widen the slot 18C at the top as well as lowering the HM1 hard mask 16 to form a recessed HM1 hard mask 16R. The top surfaces 16T and the sidewalls 16S of the HM1 hard mask 16 have been etched back by isotropic etching. This leaves the recessed HM1 hard mask 16R with lowered top surfaces 16RT and with laterally recessed sidewalls 16RS, as indicated by the phantom lines. As a result, the HM1 hard mask 16R is laterally and vertically recessed at the mouth 18M at the top of the cap hole 18C. Thus, as a result of the isotropic etching, the cap hole mouth 18M is wider than the lower portions of the cap hole 18C. Preferably, the isotropic etching process employs an etchant such as HF or HF EG which etches the material of the HM1 hard mask layer 16 about five times the rate of etching of the material of the patterned ILD1 layer 14.

FIG. 3E shows the device 10A of FIG. 3E after the step 58 of FIG. 4 of depositing a blanket cap layer 17 onto the device 10A, which overhangs the ILD1 layer because the cap hole mouth 18M was widened. The blanket capping layer 17 is composed of a dielectric which can be etched selectively relative to the ILD1 layer 14. In FIG. 3E, the cap hole 18C has been filled and the cap hole mouth 18M has been overfilled with a blanket conductor cap layer 17 covering the top surface of the silicide layer 22H, the exposed vertical and horizontal surfaces of the patterned ILD1 layer 14, and the exposed top surface 16RT and the exposed sidewalls 16RS of the recessed HM1 hard mask 16R. The blanket conductor cap layer 17 is preferably composed of a dielectric such as silicon nitride ($Si_3N_4$ referred to hereinafter as SiN).

FIG. 3F shows the device 10A of FIG. 3E after the step 59 and the first part of step 60 of FIG. 4 have been performed on the device 10A.

In step 59, as shown in FIG. 3F, the conductor cap layer 17 has been planarized to form a conductor cap 17C above the silicide layer 22H. The planarization is preferably performed by a CMP process using normal pads and slurries. The CMP process ends using an end point detector activated by detection of an oxide signal upon exposure of the top surface of the oxide in the recessed HM1 hard mask layer 16R, composed of glass materials such as TEOS, BPSG, or BSG as described above.

In the first part of step 60, as shown in FIG. 3F, a blanket second ILD2 layer 18B has been formed over the device 10A covering the top surface 16RT of the HM1 hard mask layer 16R and the top surface of the planarized cap 17C. The second ILD2 layer 18B is composed of a low k dielectric material such as CVD silicon oxide, BSPG, or HDP silicon oxide.

FIG. 3G shows the device 10 of FIG. 3F after formation of both a blanket second HM2 hard mask layer 30B and a photoresist mask 32 over the blanket second ILD2 layer 18B in accordance with the second part of step 60 and step 61 of FIG. 4.

The HM2 hard mask layer 30B, which is deposited in accordance with step 60 in FIG. 4, is composed of a material which has a high etch selectivity relative to the blanket second ILD2 layer 18B and the material of the cap nitride 17C.

The HM2 hard mask layer 30B may be an ARC (Anti-Reflective Coating) material and a suitable hard mask material such as TERA (Tunable Etch-Resistant ARC), which is described in commonly-assigned, copending U.S. published patent application 20040053504 of Wise et al. for "In-situ Plasma Etch for TERA Hard Mask Materials". See also commonly-assigned, copending U.S. patent application Ser. No. 10/249,047 of Deshpande et al. entitled "Hard Mask Integrated Etch Process for Patterning of Silicon Oxide and Other Dielectric Materials." Formation of the blanket second HM2 hard mask layer 30B is followed by forming the second photoresist PR2 mask, in accordance with step 61 in FIG. 2, with an open contact pattern window 32P therethrough over the blanket ILD2 layer 18B centered above the vertical interface between the recessed HM1 hard mask 16R and the conductor cap 17C.

FIG. 3H shows the device 10 of FIG. 3G after performing the first part of step 62 in FIG. 4 by performing anisotropic etching to form an initial contact hole pattern comprising a portion of an upper contact hole 34H extending down through the blanket second HM2 hard mask layer 30B forming HM2 hard mask 30 with an initial contact pattern hole 34H therethrough reaching the top surface of the blanket second ILD2 layer 18B. The result is that the second HM2 hard mask layer 30B has been formed into an HM2 hard mask 30.

FIG. 3I shows the device 10A of FIG. 3H after etching through the ILD2 layer 18 to deepen the contact pattern hole 34H according to the second part of step 62, followed by completion of the formation of a SAC contact hole CH according to step 63. The SAC contact pattern hole 34H is used to define the etching of the deep contact pattern hole 34D therebelow.

As shown in FIG. 1M, the HM2 hard mask 30 has been used to deepen the upper contact hole 34H down through the blanket second ILD2 layer 18B thereby forming a patterned second ILD2 layer 18, which is used to form SAC contact hole CH and deep contact pattern hole 34D.

Preferably a carbon fluoride based dry etchant is employed in a conventional dry etching tool with a time range dependent upon the thickness of the blanket second ILD2 layer 18B with a pressure in the range from about 10 mTorr to about 1000 mTorr.

FIG. 3I shows the device 10A of FIG. 3H after the steps 63: and 64 in FIG. 4 of etching an SAC contact hole CH in step 63 followed by stripping the HM2 hard mask in step 64. As shown in FIG. 3I, the HM2 hard mask 30 has been fused to deepen the upper contact hole 34H down through the blanket second ILD2 layer 18B thereby forming a patterned second ILD2 layer 18.

Further etching through the upper contact hole 34H has completed formation of a SAC contact hole CH, which includes etching by access from contact hole 34H to remove material below the contact pattern hole 34H to form a deep contact pattern hole 34D. The deep contact pattern hole 34D is formed below the contact pattern hole 34H as explained above in connection with FIGS. 1K, 1L and 1M. The deep contact pattern hole 34D is spaced to the left of the silicide conductor 20B by an electrical barrier 14B formed from a portion of the patterned ILD1 layer 14, remaining after formation of the contact pattern hole 34D.

The deep contact pattern hole 34D is formed by slowly isotropically etching with an etchant selective to the material of the capping layer through some of the conductor cap 17C forming the smooth, rounded spacer surface 17S (preferably without any edges) thereon seen in FIG. 3I, while rapidly anisotropically etching the patterned ILD1 layer 14 aside from the silicide conductor 20B down to the top surface of the substrate 12, leaving vertical sidewalls in the recessed HM1 hard mask 16R (shown on the left in FIG. 3I) and the patterned ILD1 layer 14. The smoothly profiled spacer surface 17S on the upper left of the conductor cap 17C is formed well above the conductor 20.

The deep contact pattern hole 34D below the contact pattern hole 34H is formed in the same way that the usual hole is formed in a SAC process or a borderless contact process; but in this case, the SAC process has a very high etch selectivity between the conductor cap layer 17C (preferably composed of SiN) on the one hand and the combined recessed HM1 hard mask 16R and the patterned ILD1 layer 14/ILD2 layer 18 on the other hand. The portion of the deep contact pattern hole 34D below the level of the recessed HM1 hard mask 16R has vertical sidewalls formed on all sides of pattern hole 34D in the patterned ILD1 layer 14.

An electrical barrier 14B is formed by the portion of the patterned ILD1 layer 14 between the silicide conductor 20B and the deep contact pattern hole 34D. Because the etchant is selective to the material of the conductor cap 17C, which has a very slow etching rate, the result is that there is isotropic etching of the exposed surfaces of the conductor cap 17C. The slow etching rate produces a tapered exposed surface 17S of the contact cap below the contact pattern hole 34H. The result is that an overhang portion 170 of the conductor cap 17C remains above the electrical barrier portion 14B of the patterned ILD1 layer 14 between the deep contact pattern hole 34D and the conductor 20.

FIG. 3I also shows the device 10A of FIG. 3H after step 64 in FIG. 4 of stripping the HM2 hard mask 30 in preparation for forming the blanket metallization 420 as shown in FIG. 10 which is incorporated here by reference, since the process is identical.

FIG. 3J shows the device 10A of FIG. 3I after forming the metallization 420 of the SAC overfilling the contact hole CH including the deep contact pattern hole 34D, the contact pattern hole 34H. In addition to overfilling of the hole 34H, the metallization 420 covers the top surface of the patterned ILD2 layer 18.

Preparation for forming the metallization 420 begins by precleaning to remove residual defects in the region of the contact hole CH in FIG. 3I comprising the deep contact pattern hole 34D and the contact pattern hole 34H to reduce the contact resistance between the contact and the substrate in accordance with processing steps well known to those skilled in the art.

Next as shown by FIG. 3J, step of deposition of a thin barrier layer BL follows in which a thin titanium/titanium nitride (Ti/TiN) layer or the like is formed on the exposed sidewalls of the dielectrics defining the contact hole CH including the patterned ILD1 layer 14, HM1 hard mask 16R, conductor cap 17C and second ILD2 layer 18 in the contact hole CH. The barrier layer BL is formed to prevent possible reaction between the contact metal and the sidewall dielectrics of the contact hole CH. Next, a metal deposition step follows in which the SAC metal 40, preferably composed of tungsten (W), is deposited by Plasma Vapor Deposition (PVD) over the top of the contact hole CH producing an overplated region of the SAC metal 40 extending above the top surface of patterned ILD2 layer 18.

FIG. 3K shows the device 10A of FIG. 3J after the over-plated region of SAC metal 40 has been removed by planarization using a CMP process. The process continues until an end point detector detects oxygen from the top surface of the patterned ILD2 layer 18. Then the planarization process continues briefly to remove slightly more metal along with a very thin layer of the patterned ILD layer 18 to prevent a contact short circuit which would be caused by residual metal located in local dished surfaces which may have been present on top of the patterned ILD2 layer 18, prior to deposition of the SAC metal 40.

Figure 5:
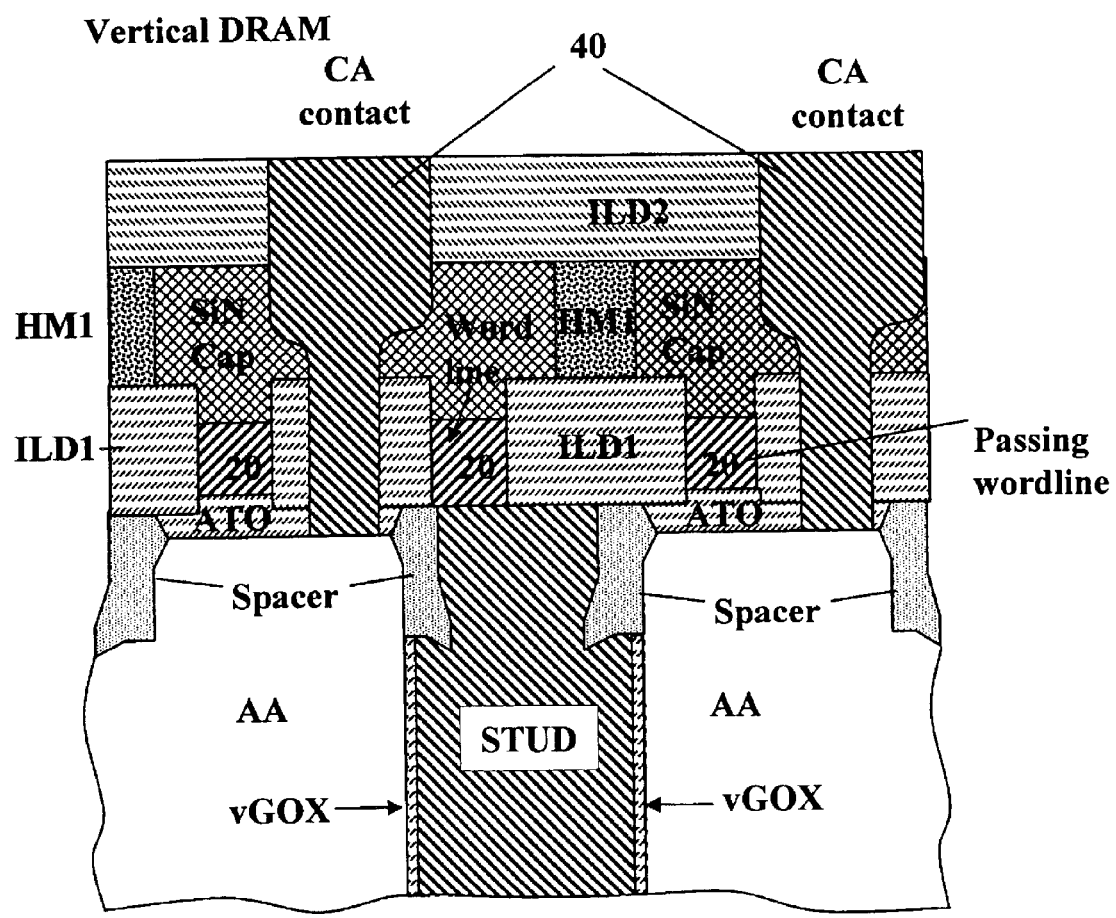
FIG. 5 shows an application of the present invention to a vertical DRAM application with CA contacts separated from word lines and other conductor lines separated by SiN caps.

FIG. 5 shows an application of the present invention to a vertical DRAM application with CA contacts 40 separated from word lines 20 and other conductor lines separated by SiN caps.

Figure 6:
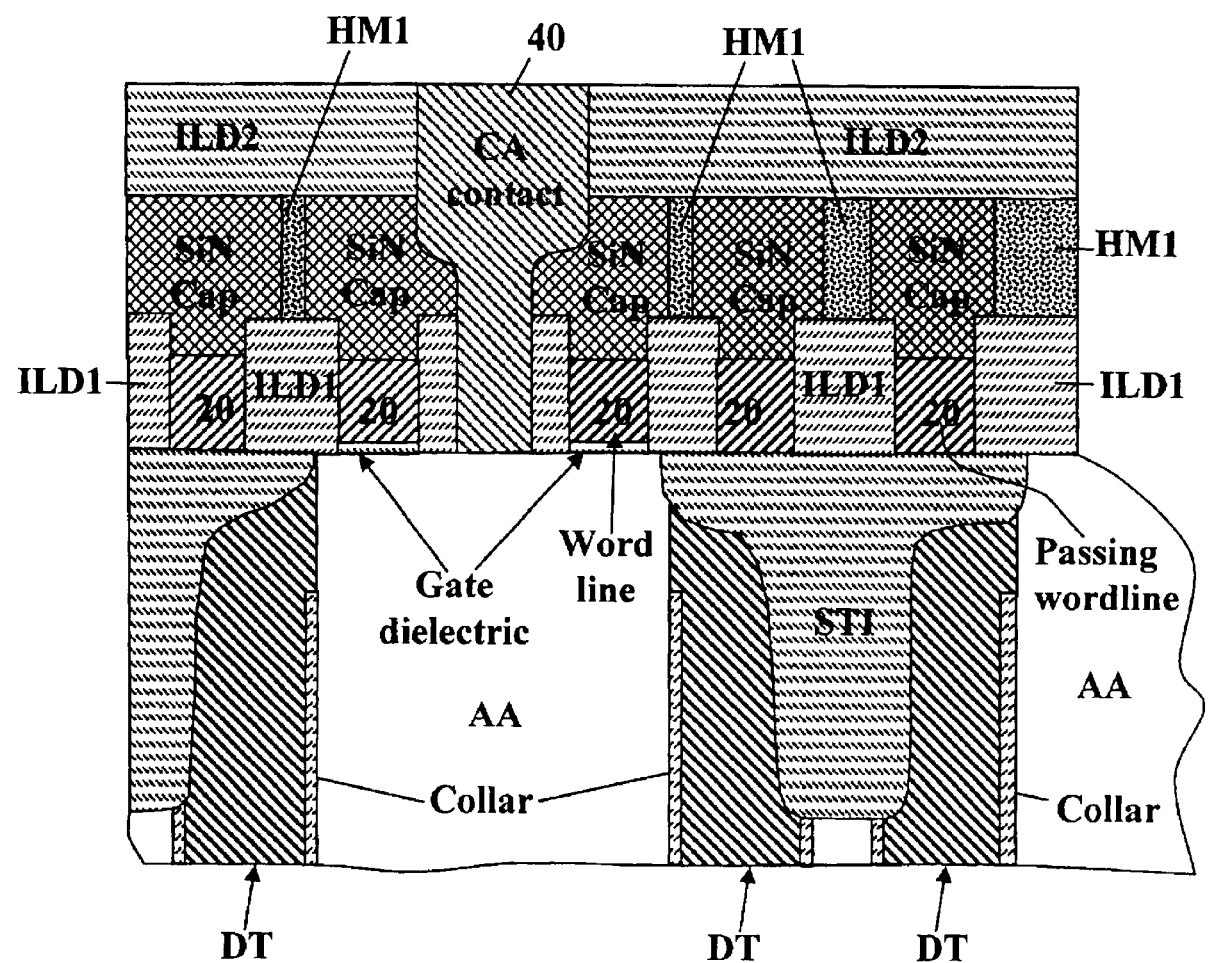
FIG. 6 shows an application of the present invention to a planar DRAM with five conductors and a CA contact separated from the conductors by a set of SiN caps.

FIG. 6 shows an application of the present invention to a planar DRAM with five conductors 20 and a CA contact 40 separated from the conductors 20 by a set of SiN caps.

Figure 7:
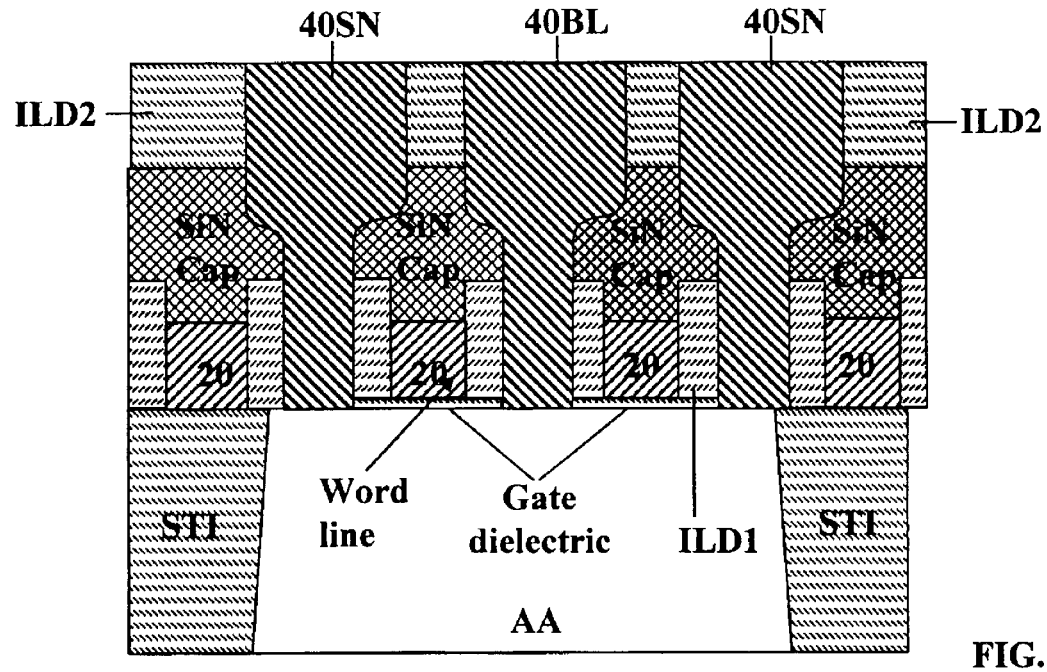
FIG. 7 shows an application of the present invention to a stack DRAM with four conductors and two storage node contacts and a bit line contact separated from the conductors by a set of SiN caps.

FIG. 7 shows an application of the present invention to a stack DRAM with four conductors 20 and two storage node contacts 40SN and a bit line contact 40BL separated from the conductors 20 by a set of SiN caps.

Figure 8:
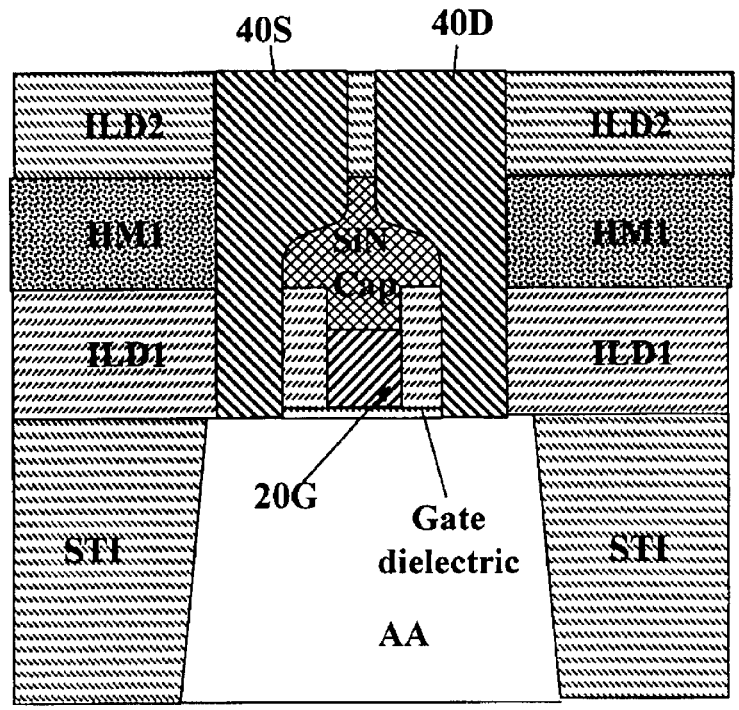
FIG. 8 shows an application of the present invention to a metal gate or SRAM with one conductors and a source contact and a drain contact separated from the conductors by a single SiN cap.

FIG. 8 shows an application of the present invention to a metal gate or SRAM with one conductor 20 and a source contact 40S and a drain contact 40D separated from the conductors 20 by a single SiN cap.

Figure 9:
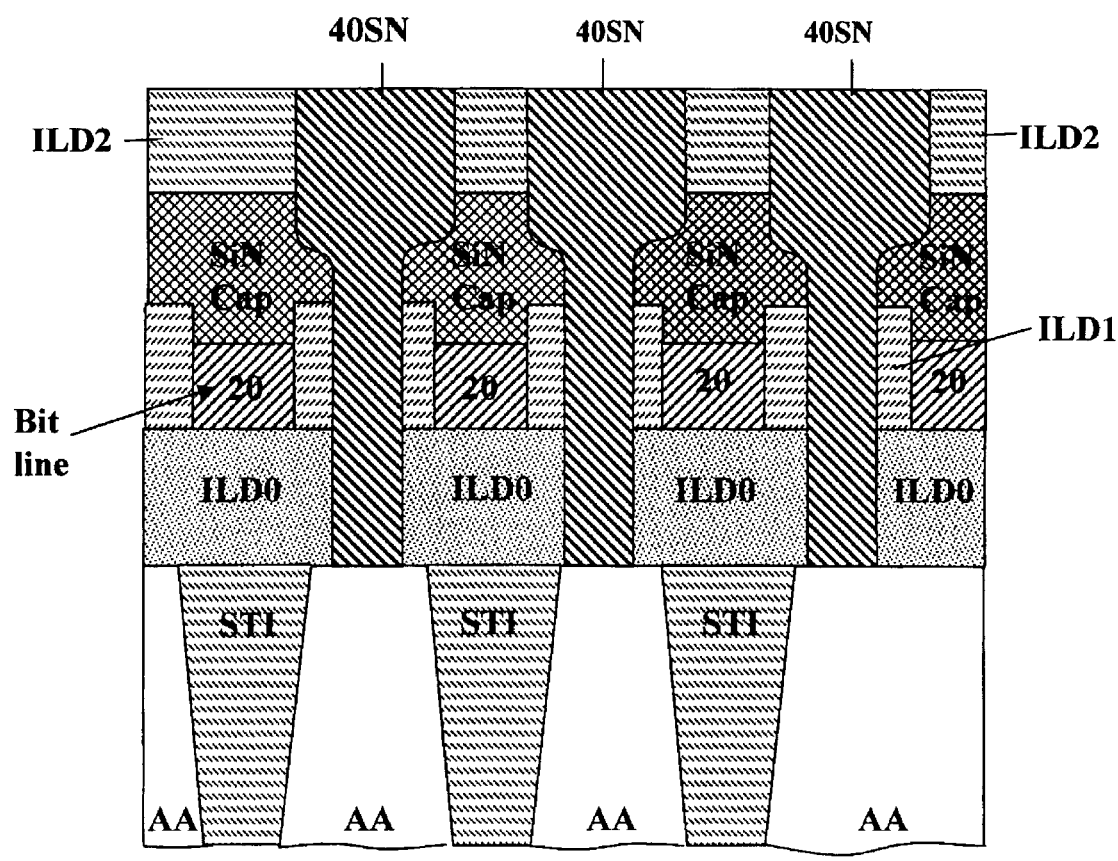
FIG. 9 shows an application of the present invention to a capacitor contact over a bit line for a stack DRAM with four conductors and three storage node contacts separated from the conductors by a set of SiN caps.

FIG. 9 shows an application of the present invention to a capacitor contact over a bit line for a stack DRAM with four conductors 20 and three storage node contacts 40SN separated from the conductors 20 by a set of SiN caps.

FIG. 10 shows an application of the present invention to an FET with conductors comprising a control gate 20CG and a floating gate 20FG and a source contact 40S and a drain contact 40D separated from the conductors 20 by a single SiN cap.

Figure 11:
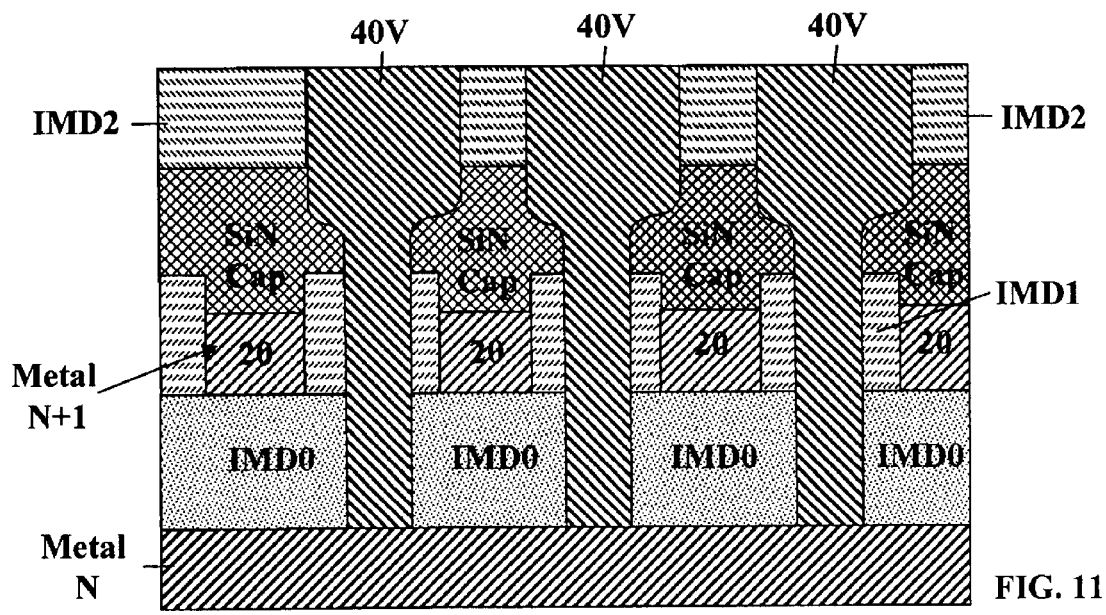
FIG. 11 shows an application of the present invention to a high density interconnect line for a BEOL application with four conductors and three via contacts separated from the conductors by a set of SiN caps.

FIG. 11 shows an application of the present invention to a high density interconnect line for a BEOL application with four conductors 20 and three via contacts 40VC separated from the conductors 20 by a set of SiN caps.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

What is claimed is:

1. A method of forming a device including a conductor and a contact over a semiconductor substrate comprising the steps as follows:
   depositing a first dielectric layer on a semiconductor substrate with a top surface;
   depositing a first hard mask layer over the top surface of the first dielectric layer;
   forming a conductor line slot in the device extending through the first hard mask layer and at least down into the first dielectric layer;
   forming a conductor in the conductor line slot below the top surface of the first hard mask layer;
   widening the conductor line slot in the first hard mask-layer to form a widened conductor line slot;
   forming a capping layer in the widened conductor line slot covering the conductor;
   depositing a second dielectric layer over the first hard mask layer;
   etching an initial contact hole through the second dielectric layer down to the top surface of the first hard mask layer;
   etching a deep contact hole through the first hard mask layer and the first dielectric layer down to the substrate with an etchant selective to the capping layer; and
   filling the deep contact hole and the initial contact hole with contact metallization.

2. The method of claim 1 wherein the conductor line slot in the device extends through the first hand mask layer and through the first dielectric layer and down to the substrate.

3. The method of claim 2 wherein a dielectric layer is formed on the surface of the substrate after forming the conductor line slot down to the substrate and before forming the conductor in the conductor slot.

4. The method of claim 1 wherein the etching of the deep contact hole forms a smooth tapered spacer surface in the deep contact hole on the capping layer over the conductor.

5. The method of claim 1 wherein the conductor line slot in the device extends through/the hard-mask and through only a portion of the first dielectric layer to a depth above the substrate.

6. The method of claim 1 wherein the first dielectric layer comprises a low k dielectric material and the capping layer comprises silicon nitride.

7. The method of claim 1 wherein the first dielectric layer comprises High Density Plasma (HDP) silicon oxide and the capping layer comprises silicon nitride.

8. The method of claim 1 wherein a second hard mask layer and a patterned photoresist mask are formed over the second dielectric layer before etching the contact hole through the second dielectric layer down to the top surface of the first hard mask layer and the patterned photoresist mask and the second hard mask layer are employed for patterning the initial contact hole.

9. The method of claim 1 wherein the conductor comprises a damascene conductor formed from conformal underlayers etched back into the slot.

10. The method of claim 1 wherein the conductor comprises a suicide conductor.

11. A method of forming a device including a conductor and a Self-Aligned Contact (SAC) over a semiconductor substrate comprising the step as follows:
   depositing a first InterLayer Dielectric (ILD1) layer on a semiconductor substrate with a top surface;
   depositing a first hard mask layer (HM1) having a top surface over the top surface of the ILD1 layer;
   forming a conductor line slot in the device extending through the first hard mask and at least down into the ILD1 layer;
   forming a conductor in the conductor line slot below the top surface of the HM1 layer;
   widening the conductor line slot in the HM1 layer to form a widened conductor line slot above the ILD1 layer;
   forming a capping layer composed of silicon nitride in the widened conductor line slot covering the conductor and overhanging the ILD1 layer;
   planarizing the capping layer to the top surface of the HM1 layer;
   depositing a second-first InterLayer Dielectric (ILD2) layer over the HM1 layer device;
   forming a second hard mask layer (HM2) over the ILD2 layer;
   forming a photoresist mask over the HM2 layer;
   etching an initial contact hole through the photoresist mask, the HM2 layer and the second-dielectric layer down to the top surface of the HM1 layer;
   etching a deep contact hole through the HM1 layer and ILD1 layer down to the substrate with an etchant selective to the capping layer; and filling the deep contact hole and the Initial contact hole with contact metallization.

12. The method of claim 11 wherein the conductor line slot in the device extends through the HM1 mask and through the ILD1 layer and down to the substrate.

13. The method of claim 12 wherein a dielectric layer is formed on the surface of the substrate after forming the conductor line slot down to the substrate and before forming the conductor in the conductor slot.

14. The method of claim 11 wherein the etching of the deep contact hole forms a smooth tapered spacer surface in the deep contact hole on the capping layer over the conductor.

15. The method of claim 11 wherein the conductor line slot in the device extends through the HM1 mask and through only a portion of the ILD1 layer to a depth above the substrate.

16. The method of claim 11 wherein the ILD1 layer comprises a low k dielectric material.

17. The method of claim 11 wherein the ILD1 layer comprises High Density Plasma (HDP) silicon oxide.

18. The method of claim 11 wherein the conductor comprises a damascene conductor formed from conformal underlayers etched back into the slot.

19. The method of claim 11 wherein the conductor comprises a silicide conductor.

* * * * *